US012588203B2

(12) United States Patent
Choi et al.

(10) Patent No.: US 12,588,203 B2
(45) Date of Patent: Mar. 24, 2026

(54) SEMICONDUCTOR MEMORY DEVICE WITH DECREASED PARASITIC CAPACITANCE

(71) Applicant: SK hynix Inc., Icheon-si (KR)

(72) Inventors: Won Geun Choi, Icheon-si (KR); Mi Seong Park, Icheon-si (KR); Jung Shik Jang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 475 days.

(21) Appl. No.: 18/098,552

(22) Filed: Jan. 18, 2023

(65) Prior Publication Data

US 2024/0023332 A1     Jan. 18, 2024

(30) Foreign Application Priority Data

Jul. 15, 2022     (KR) ........................ 10-2022-0087674

(51) Int. Cl.
H10B 43/27          (2023.01)

(52) U.S. Cl.
CPC .................................... H10B 43/27 (2023.02)

(58) Field of Classification Search
CPC ........ H10B 53/00; H10B 53/10; H10B 53/20;
H10B 53/30; H10B 53/40; H10B 53/50;
H10B 41/00; H10B 41/10; H10B 41/20;
H10B 41/23; H10B 41/27; H10B 41/30;
H10B 41/35; H10B 41/40–44; H10B
41/46–50; H10B 41/60; H10B 41/70;
H10B 43/00; H10B 43/10; H10B 43/20;
H10B 43/23; H10B 43/27; H10B 43/30;
H10B 43/35; H10B 43/40; H10B 43/50;
(Continued)

(56) References Cited

U.S. PATENT DOCUMENTS

2012/0112260 A1*   5/2012  Kim ..................... H10D 30/693
257/314
2012/0168824 A1*   7/2012  Lee ........................ H10B 43/27
257/E21.41
(Continued)

FOREIGN PATENT DOCUMENTS

JP          2020155691 A      9/2020
KR     1020140113031 A      9/2014
(Continued)

*Primary Examiner* — William B Partridge
*Assistant Examiner* — Gustavo G Ramallo
(74) *Attorney, Agent, or Firm* — WILLIAM PARK AND ASSOCIATES LTD.

(57)          ABSTRACT

A semiconductor memory device is provided. The semiconductor memory device includes a gate stacked structure including conductive layers, each of the conductive layers extending in a first direction and a second direction and including a top surface facing a third direction, wherein the conductive layers are stacked to be spaced apart from each other in the third direction. Also, the semiconductor memory device includes a first channel structure and a second channel structure extending in the third direction to pass through the gate stacked structure and spaced apart from each other in the second direction, a first insulating layer disposed over the gate stacked structure, an etch stop layer disposed over the first insulating layer and including a trench, an insulating material in the trench, and a bit line contact passing through the insulating material.

20 Claims, 39 Drawing Sheets

(58) Field of Classification Search
CPC ........ H10B 51/00; H10B 51/10; H10B 51/20;
H10B 51/30; H10B 51/40; H10B 51/50
See application file for complete search history.

(56) References Cited

U.S. PATENT DOCUMENTS

| | | | | |
|---|---|---|---|---|
| 2013/0214344 | A1* | 8/2013 | Lim ....................... | H10D 30/69 |
| | | | | 257/324 |
| 2018/0247949 | A1* | 8/2018 | Choi ...................... | H10B 41/27 |

FOREIGN PATENT DOCUMENTS

| | | | |
|---|---|---|---|
| KR | 1020150108179 | A | 9/2015 |
| KR | 1020200125148 | A | 11/2020 |
| KR | 1020200127514 | A | 11/2020 |
| KR | 1020210010210 | A | 1/2021 |

* cited by examiner

DR3
DR2 DR1

(A4 ←——→ A4')

SEMICONDUCTOR MEMORY DEVICE WITH DECREASED PARASITIC CAPACITANCE

CROSS-REFERENCE TO RELATED APPLICATION

The present application claims priority under 35 U.S.C. § 119(a) to Korean patent application number 10-2022-0087674, filed on Jul. 15, 2022, in the Korean Intellectual Property Office, the entire disclosure of which is incorporated herein by reference.

BACKGROUND

1. Technical Field

Various embodiments of the present disclosure generally relate to a semiconductor memory device, and more particularly, to a three-dimensional semiconductor memory device.

2. Related Art

A semiconductor memory device may include a plurality of memory cells capable of storing data. A plurality of memory cells of a three-dimensional semiconductor memory device may be arranged in three dimensions. In the three-dimensional semiconductor memory device, the plurality of memory cells may be coupled in series by a channel structure that passes through a gate stacked structure.

SUMMARY

According to an embodiment of the present disclosure, a semiconductor memory device may include a gate stacked structure including conductive layers, each of conductive layers extending in a first direction and a second direction and including a top surface facing a third direction, wherein the conductive layers are stacked to be spaced apart from each other in the third direction, a first channel structure and a second channel structure extending in the third direction to pass through the gate stacked structure and spaced apart from each other in the second direction, a first insulating layer disposed over the gate stacked structure, an etch stop layer disposed over the first insulating layer and including a trench, the trench extending in a diagonal direction between the first direction and the second direction, a second insulating layer including a horizontal portion and a protrusion, the horizontal portion located over the etch stop layer and the protrusion extending from the horizontal portion and into the trench, a first bit line disposed in the second insulating layer and extending in the second direction to overlap with the first channel structure and the second channel structure, and a first bit line contact extending from the first bit line to pass through the first insulating layer in a part where the first bit line overlaps with the trench.

According to an embodiment of the present disclosure, a semiconductor memory device may include a gate stacked structure including conductive layers, each of the conductive layers extending in a first direction and a second direction and including a top surface facing a third direction, wherein the conductive layers are stacked to be spaced apart from each other in the third direction, a first channel structure and a second channel structure extending in the third direction to pass through the gate stacked structure, and are spaced apart from each other in the second direction, a first insulating layer disposed over the gate stacked structure, an etch stop layer disposed over the first insulating layer, a first insulating line and a second insulating line passing through the etch stop layer and the first insulating layer, extending in the second direction to overlap with the first channel structure and the second channel structure, and spaced apart from each other in the first direction, a first bit line contact passing through the first insulating line and the first insulating layer in a part where the first insulating line overlaps with the first channel structure, and a second bit line contact passing through the second insulating line and the first insulating layer in a part where the second insulating line overlaps with the second channel structure.

DETAILED DESCRIPTION

Specific structural and functional descriptions disclosed herein are merely illustrative for the purpose of describing embodiments according to the concept of the present disclosure. Embodiments according to the concept of the present disclosure can be implemented in various forms, and they should not be construed as being limited to the specific embodiments set forth herein.

It will be understood that, although the terms "first," "second," etc. may be used herein to describe various elements, these elements should not be limited by these terms. These terms are used for distinguishing one element from another element and not to suggest a number or order of elements.

Various embodiments are directed to a semiconductor memory device capable of securing process margins and improving operational reliability thereof.

Figure 1:
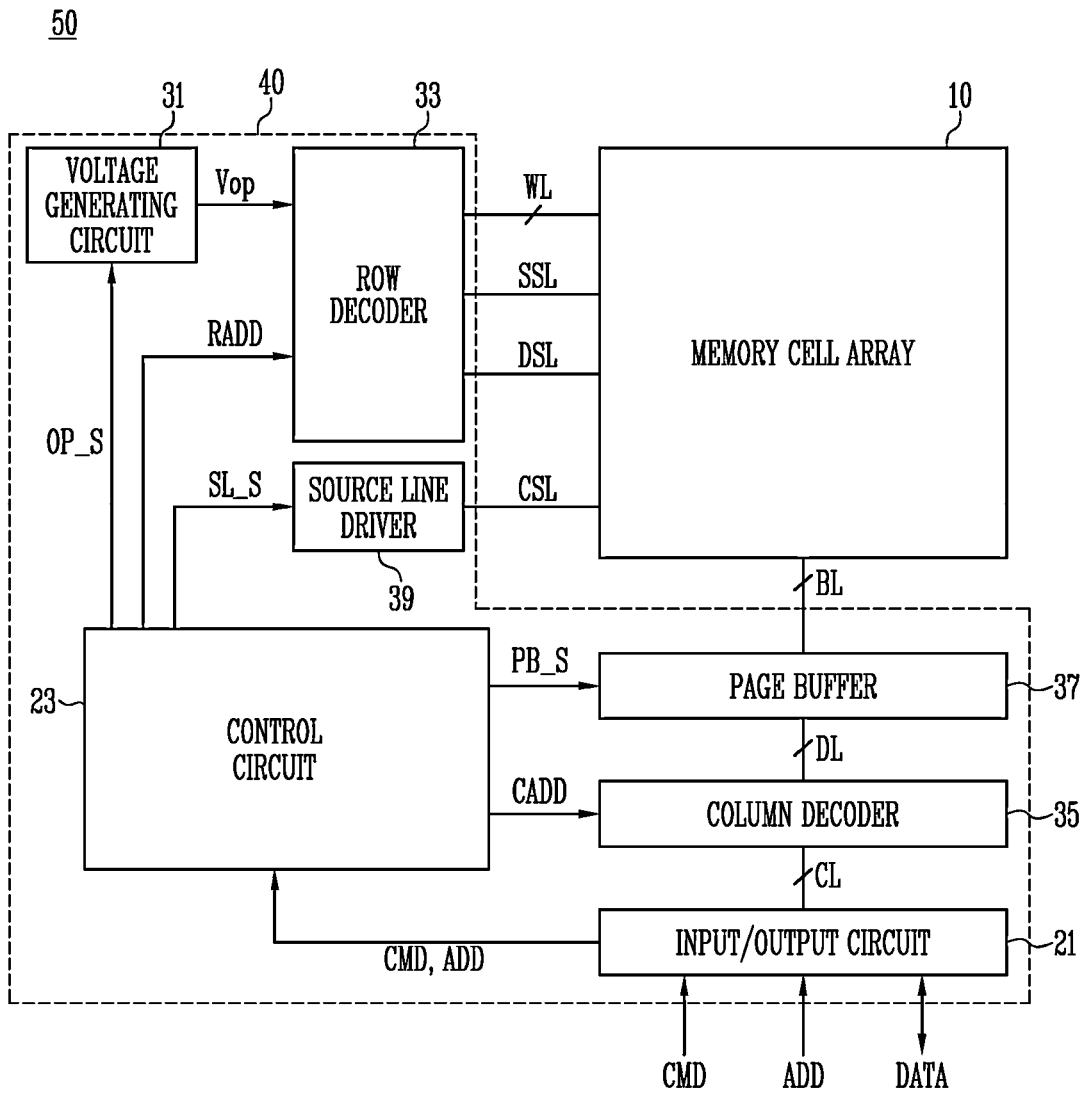
FIG. 1 is a block diagram illustrating a semiconductor memory device according to an embodiment.

FIG. 1 is a block diagram illustrating a semiconductor memory device 50 according to an embodiment.

Referring to FIG. 1, the semiconductor memory device 50 may include a peripheral circuit structure 40 and a memory cell array 10.

The peripheral circuit structure 40 may be configured to perform a program operation to store data in the memory cell array 10, a read operation to output the data stored in the memory cell array 10, and an erase operation to erase the data stored in the memory cell array 10. According to an embodiment, the peripheral circuit structure 40 may include an input/output circuit 21, a control circuit 23, a voltage generating circuit 31, a row decoder 33, a column decoder 35, a page buffer 37, and a source line driver 39.

The memory cell array 10 may be connected to the peripheral circuit structure 40 through a common source line CSL, a bit line BL, a drain select line DSL, a word line WL, and a source select line SSL.

The input/output circuit 21 may transfer a command CMD and an address ADD received from an external device (for example, a memory controller) of the semiconductor memory device 50 to the control circuit 23. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate various operating voltages Vop used for performing the program operation, the read operation, and the erase operation in response to the operation signal OP_S.

The row decoder 33 may transfer the operating voltages Vop to the drain select line DSL, the word line WL, and the source select line SSL in response to the row address RADD.

The column decoder 35 may transmit the data DATA input from the input/output circuit 21 to the page buffer 37 or transmit the data DATA stored in the page buffer 37 to the input/output circuit 21 in response to the column address CADD. The column decoder 35 may exchange the data DATA with the input/output circuit 21 through a column line CL. The column decoder 35 may exchange the data DATA with the page buffer 37 through a data line DL.

The page buffer 37 may store read data received through the bit line BL in response to the page buffer control signal PB_S. The page buffer 37 may sense a voltage or a current of the bit line BL during the read operation.

The source line driver 39 may control a voltage applied to the common source line CSL in response to the source line control signal SL_S.

Figure 2:
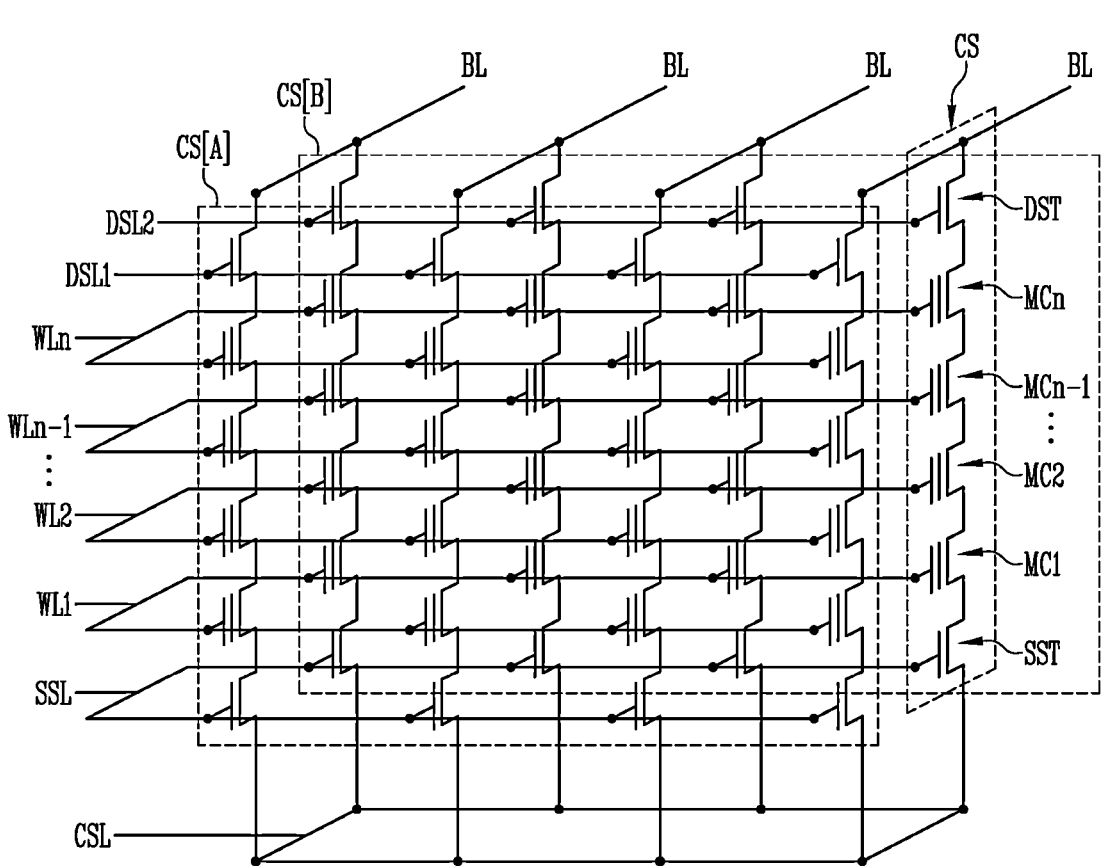
FIG. 2 is a circuit diagram illustrating a memory cell array according to an embodiment.

FIG. 2 is a circuit diagram illustrating a memory cell array according to an embodiment.

Referring to FIG. 2, the memory cell array may include a plurality of memory cell strings CS.

Each of the memory cell strings CS may include at least one source select transistor SST, a plurality of memory cells MC1 to MCn and at least one drain select transistor DST.

The plurality of memory cells MC1 to MCn may be coupled in series between the source select transistor SST and the drain select transistor DST. The source select transistor SST, the plurality of memory cells MC1 to MCn, and the drain select transistor DST may be coupled in series by a channel structure.

The plurality of memory cell strings CS may be connected in parallel to the common source line CSL. Each of the memory cell strings CS may be connected to a corresponding one bit line of the plurality of bit lines BL. The common source line CSL and the plurality of bit lines BL may be connected to channel structures of the plurality of memory cell strings CS.

The plurality of memory cells MC1 to MCn of each of the memory cell strings CS may be connected to the common source line CSL via the source select transistor SST. The plurality of memory cells MC1 to MCn of each of the memory cell strings CS may be connected to a corresponding bit line BL via the drain select transistor DST.

Each of the memory cell strings CS may be connected to the source select line SSL, a plurality of word lines WL1 to WLn, and a drain select line DSL1 or DSL2. The source select line SSL may serve as a gate electrode of the source select transistor SST. The plurality of word lines WL1 to WLn may serve as gate electrodes of the plurality of memory cells MC1 to MCn. The drain select line DSL1 or DSL2 may serve as a gate electrode of the drain select transistor DST.

Each of the plurality of word lines WL1 to WLn may be configured to control the plurality of memory cell strings CS. The plurality of memory cell strings CS may be divided into two or more memory cell string groups. Each of the bit lines BL may be connected to the memory cell strings CS included in different memory cell string groups. According to an embodiment, one memory cell string of a first memory cell string group CS[A] and one memory cell string of a second memory cell string group CS[B] may be connected to each of the bit lines BL. The first memory cell string group CS[A] and the second memory cell string group CS[B] may be controlled independently of each other by separate drain select lines or separate source select lines. According to an embodiment, the first memory cell string group CS[A] may be connected to a first drain select line DSL1 and the second memory cell string group CS[B] may be connected to a second drain select line DSL2. The first memory cell string group CS[A] and the second memory cell string group CS[B] may be connected to the same source select line SSL. However, embodiments of the present disclosure are not limited thereto. According to another embodiment, two or more memory cell strings connected to the same bit line BL may be connected to the same drain select line and may be connected to two or more separate source select lines in a one-to-one manner. According to another embodiment, two or more memory cell strings connected to the same bit line BL may be connected to two or more separate drain select lines in a one-to-one manner and may be connected to two or more separate source select lines in a one-to-one manner.

An operating voltage for precharging a channel structure of a memory cell string CS corresponding to each of the bit lines BL may be applied to each of the bit lines BL. The bit line BL may be connected to the channel structure of the memory cell string CS through a bit line contact.

An operating voltage for discharging a potential of the channel structure of the memory cell string CS may be applied to the common source line CSL. The common source line CSL may be connected to the memory cell string CS through a doped semiconductor structure.

Figure 3A:
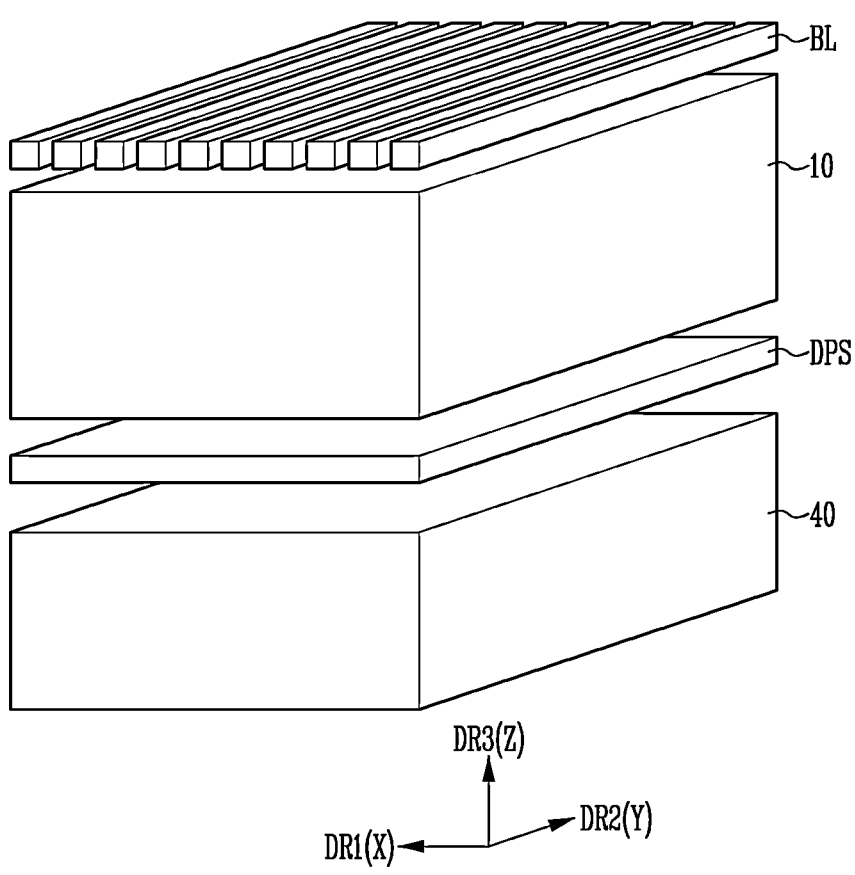
FIGS. 3A and 3B are diagrams illustrating components of a semiconductor memory device that are vertically arranged according to embodiments.
Figure 3B:
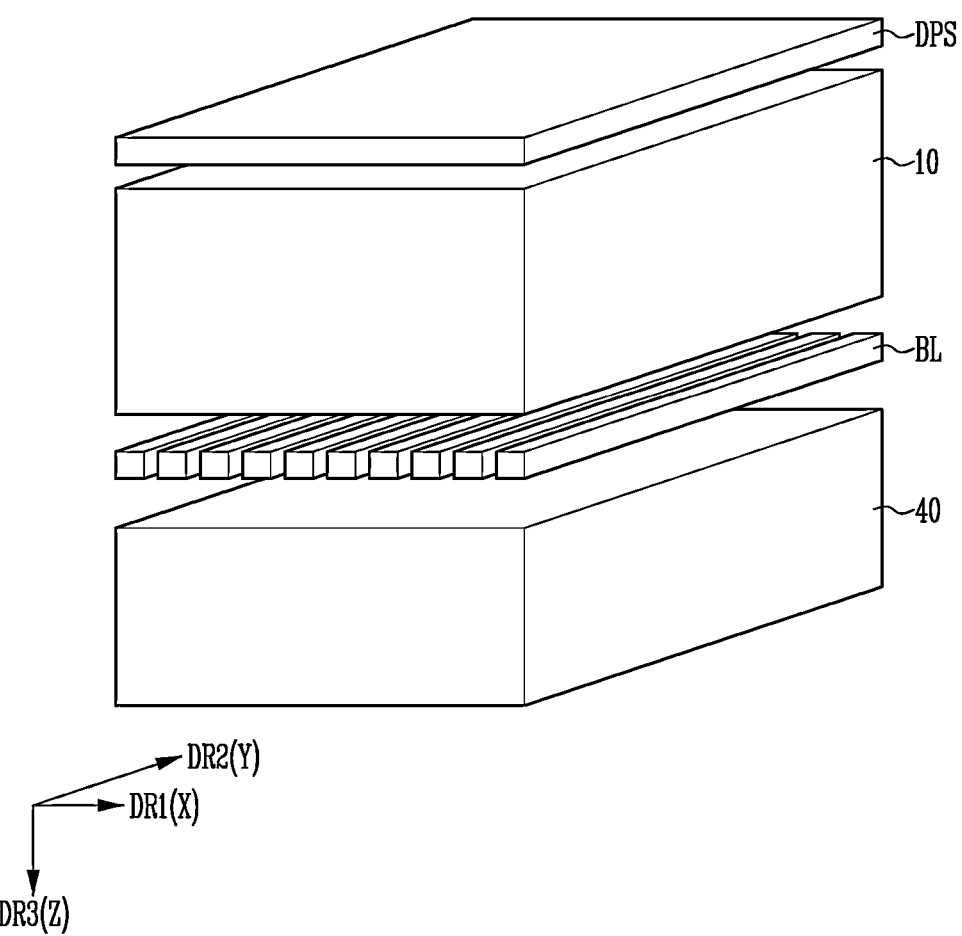

FIGS. 3A and 3B are diagrams illustrating components of a semiconductor memory device that are vertically arranged according to embodiments.

Referring to FIGS. 3A and 3B, the semiconductor memory device may include a doped semiconductor structure DPS, the memory cell array 10, the peripheral circuit structure 40, and the plurality of bit lines BL. The doped semiconductor structure DPS may have a plate shape that extends in a first direction DR1 and a second direction DR2 and may face the plurality of bit lines BL in a third direction DR3. According to an embodiment, the first direction DR1, the second direction DR2, and the third direction DR3 may correspond to an X axis, a Y axis, and a Z axis, respectively. The doped semiconductor structure DPS may be connected to the common source line CSL shown in FIG. 2. The memory cell array 10 may be disposed between the plurality of bit lines BL and the doped semiconductor structure DPS. In an embodiment the doped semiconductor structure DPS may be disposed between the memory cell array 10 and the peripheral circuit structure 40 as shown in, for example, FIG. 3A.

Referring to FIG. 3A, the peripheral circuit structure 40 of the semiconductor memory device may be adjacent to the doped semiconductor structure DPS. Although not illustrated in FIG. 3A, a plurality of interconnections, or a plurality of interconnections and a plurality of conductive bonding pads may be disposed between the peripheral circuit structure 40 and the doped semiconductor structure DPS.

Referring to FIG. 3B, the peripheral circuit structure 40 of the semiconductor memory device may be adjacent to the plurality of bit lines BL. Although not illustrated in FIG. 3B, a plurality of interconnections, or a plurality of interconnections and a plurality of conductive bonding pads may be disposed between the peripheral circuit structure 40 and the plurality of bit lines BL.

Referring to FIGS. 3A and 3B, the doped semiconductor structure DPS, the memory cell array 10, and the plurality of bit lines BL may overlap with the peripheral circuit structure 40.

According to an embodiment, a process for forming the memory cell array 10 may be performed on the peripheral circuit structure 40. According to another embodiment, a first structure including the memory cell array 10 may be formed separately from a second structure including the peripheral circuit structure 40. When the first structure and the second structure are formed separately from each other, the first structure and the second structure may be bonded together by a plurality of conductive bonding pads.

Hereinafter, embodiments of the memory cell array 10 shown in FIGS. 3A and 3B are described in more detail.

Figure 4:
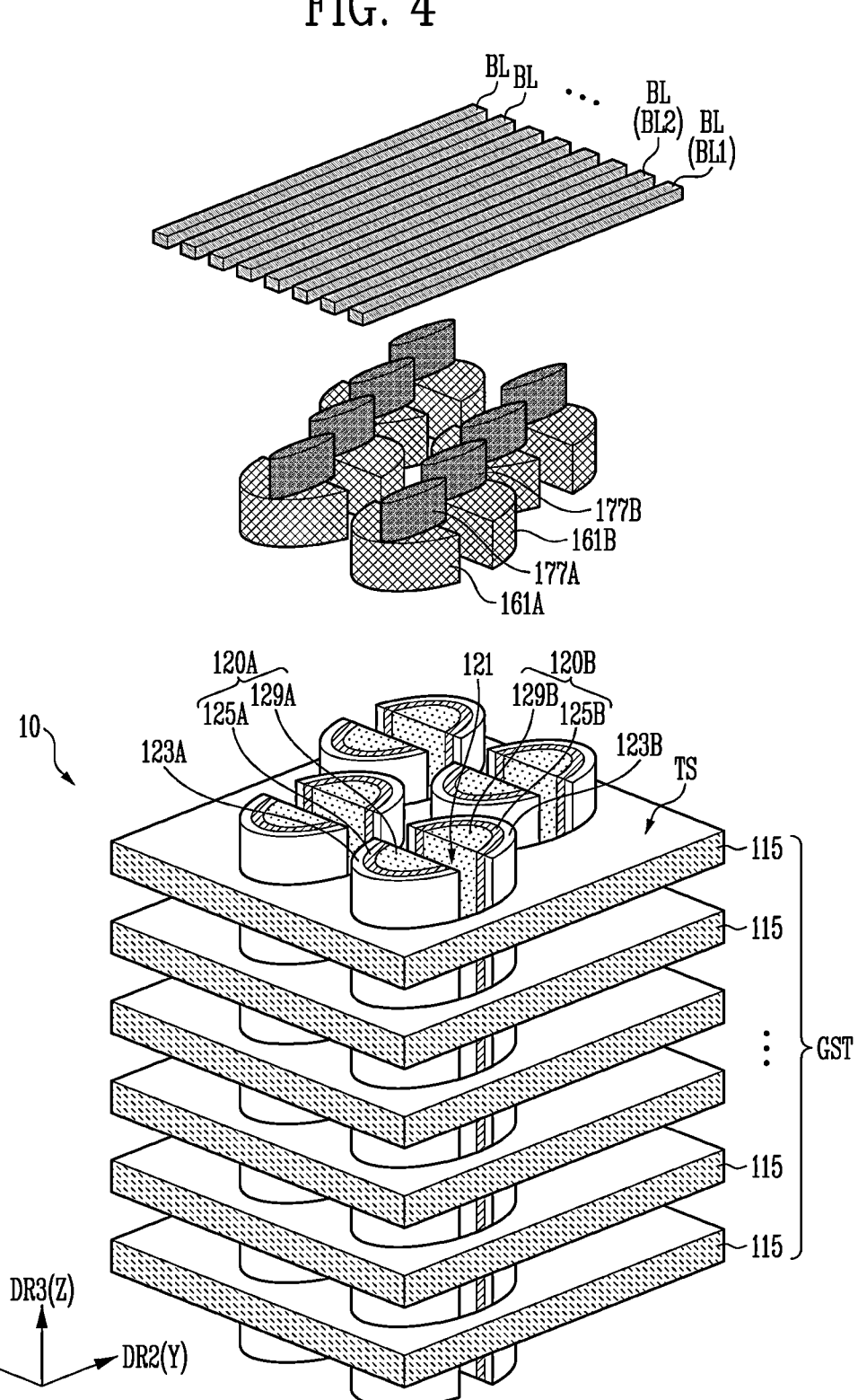
FIG. 4 is a perspective view illustrating a semiconductor memory device according to an embodiment.

FIG. 4 is a perspective view illustrating a semiconductor memory device according to an embodiment. For convenience of recognition, illustration of some components is omitted.

Figure 5:
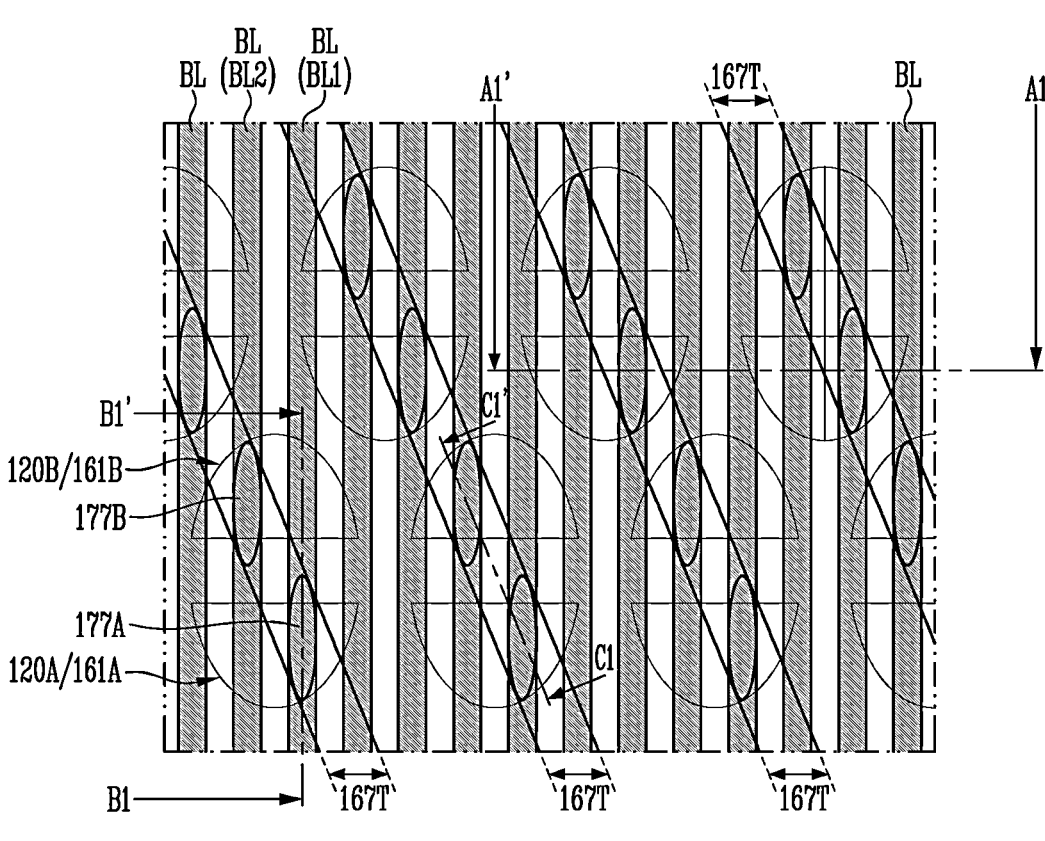
FIG. 5 is a plan view illustrating an arrangement of a plurality of channel structures, a plurality of channel contacts, a plurality of bit line contacts, and a plurality of bit lines of a semiconductor memory device shown in FIG. 4.
Figure 5:
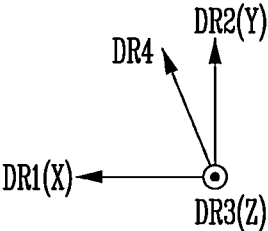

FIG. 5 is a plan view illustrating an arrangement of a plurality of channel structures, a plurality of channel contacts, a plurality of bit line contacts, and a plurality of bit lines of the semiconductor memory device shown in FIG. 4.

Referring to FIGS. 4 and 5, the semiconductor memory device may include the memory cell array 10 connected to the plurality of bit lines BL. The memory cell array 10 may be provided as a three-dimensional memory cell array. To provide the three-dimensional memory cell array, the memory cell array 10 may include a gate stacked structure GST including a plurality of conductive layers 115, a plurality of channel structures 120A and 120B that pass through the gate stacked structure GST, and a plurality of memory layers 123A and 123B between the plurality of channel structures 120A and 120B and the gate stacked structure GST.

Each of the conductive layers 115 may have a plate shape that extends in the first direction DR1 and the second direction DR2 that are defined with reference to FIGS. 3A and 3B. A top surface TS of each of the conductive layers 115 may extend in the first direction DR1 and the second direction DR2 and face the third direction DR3 that is defined with reference to FIGS. 3A and 3B.

The plurality of conductive layers 115 may be stacked to be spaced apart from each other in the third direction DR3. The plurality of conductive layers 115 may be provided as at least one layer of the source select line SSL, the plurality of word lines WL1 to WLn, and at least one layer of the drain select line DSL1 or DSL2 shown in FIG. 2. Each of the conductive layers 115 may include at least one of a doped semiconductor layer, a metal layer, and a conductive metal nitride layer. The doped semiconductor layer may include a doped silicon layer. The metal layer may include tungsten, copper, molybdenum, or the like. The conductive metal nitride layer may include a titanium nitride, a tantalum nitride, or the like.

The gate stacked structure GST may include a plurality of channel holes 121. The plurality of channel holes 121 may extend in the third direction DR3 to pass through the plurality of conductive layers 115. In an embodiment, to increase arrangement density of the plurality of channel holes 121 in the gate stacked structure GST, the plurality of channel holes 121 may be arranged in a zigzag pattern.

The plurality of channel structures 120A and 120B may include a plurality of first channel structures 120A and a plurality of second channel structures 120B that form a plurality of pairs. The plurality of pairs of the first channel structure 120A and the second channel structure 120B may correspond to the plurality of channel holes 121 in a one-to-one manner. The first channel structure 120A and the second channel structure 120B of each of the plurality of pairs may be arranged to be spaced apart from each other in the second direction DR2 in the corresponding channel hole 121.

The plurality of memory layers 123A and 123B may include a plurality of first memory layers 123A and a plurality of second memory layers 123B that form a plurality of pairs. The plurality of pairs of the first memory layer 123A and the second memory layer 123B may correspond to the plurality of channel holes 121 in a one-to-one manner. The first memory layer 123A and the second memory layer 123B of each of the plurality of pairs may be arranged to be spaced apart from each other in the second direction DR2 in the corresponding channel hole 121.

The plurality of pairs of the first memory layer 123A and the second memory layer 123B may correspond to the plurality of pairs of the first channel structure 120A and the second channel structure 120B in a one-to-one manner. The first memory layer 123A may be disposed between the corresponding first channel structure 120A and the gate stacked structure GST and the second memory layer 123B may be disposed between the corresponding second channel structure 120B and the gate stacked structure GST.

A plurality of memory cells of the memory cell array 10 may be provided at intersections of conductive layers, which are provided as word lines among the plurality of conductive layers 115, and the first channel structure 120A and intersections of the conductive layers, which are provided as the word lines among the plurality of conductive layers 115, and the second channel structure 120B. Because the first channel structure 120A and the second channel structure 120B of each of the plurality of pairs are spaced apart from each other in the same channel hole 121, a memory cell string that is defined along the first channel structure 120A and a memory cell string that is defined along the second channel structure 120B may be controlled independently of each other. The first channel structure 120A and the second channel structure 120B of each of the plurality of pairs may be surrounded by each of the conductive layers 115. In other words, each of the conductive layers 115 may continuously extend to surround the first channel structure 120A and the second channel structure 120B of each of the plurality of pairs in a plane in which each of the conductive layers 115 is disposed. According to an embodiment, each of the conductive layers 115 may extend along an XY plane to surround the first channel structure 120A and the second channel structure 120B of each of the plurality of pairs. Accordingly, the first channel structure 120A and the second channel structure 120B of each of the plurality of pairs may be controlled by the same conductive layer.

The memory cell array 10 may be connected to the plurality of bit lines BL through a plurality of bit line contacts 177A and 177B. The plurality of bit line contacts 177A and 177B may include a conductive material and may include a plurality of first bit line contacts 177A and a plurality of second bit line contacts 177B that form a plurality of pairs. The plurality of pairs of the first bit line contact 177A and the second bit line contact 177B may correspond to the plurality of pairs of the first channel structure 120A and the second channel structure 120B in a one-to-one manner. The first bit line contact 177A may be connected to the corresponding first channel structure 120A and the second bit line contact 177B may be connected to the corresponding second channel structure 120B.

The semiconductor memory device may further include a plurality of channel contacts 161A and 161B between the plurality of bit line contacts 177A and 177B and the memory cell array 10. More specifically, the plurality of channel contacts 161A may be disposed between the plurality of bit line contacts 177A and the memory cell array 10, and the plurality of channel contacts 161B may be disposed between the plurality of bit line contacts 177B and the memory cell array 10. The plurality of channel contacts 161A and 161B may include a conductive material and may have similar cross-sectional structures to the plurality of channel structures 120A and 120B. The cross-sectional structures of the plurality of channel structures 120A and 120B may be associated with cross-sectional structures of the plurality of channel holes 121. Each of the plurality of channel holes 121 may have a width in the second direction DR2 which is greater than a width in the first direction DR1. Due to the widths that are different according to the directions, each of the channel holes 121 may be formed to have a cross-sectional structure that has a shape including, but not limited to, a circle, an ellipse, a square, or a polygon. The first channel structure 120A and the second channel structure 120B of each of the plurality of pairs may be disposed at opposite ends of the corresponding channel hole 121 and may have shapes corresponding to cross-sectional structures of the opposite ends of the channel hole 121. According to an embodiment, a shape of the cross-sectional structure of the channel hole 121 may be an ellipse which has the minor axis extending in the first direction DR1 and the major axis extending in the second direction DR2, and the first channel structure 120A and the second channel structure 120B of each of the plurality of pairs may have semi-ellipse shapes that are symmetrical to each other to correspond to the above-described shape of the cross-sectional structure of the channel hole 121. Each of the plurality of channel contacts 161A and 161B may have a semi-ellipse shape similar to the shape of the cross-sectional structure of the corresponding channel structure.

The plurality of channel contacts 161A and 161B may include a plurality of first channel contacts 161A and a plurality of second channel contacts 161B that form a plurality of pairs. The plurality of pairs of the first channel contact 161A and the second channel contact 161B may correspond to the plurality of pairs of the first channel structure 120A and the second channel structure 120B in a one-to-one manner. The first channel contact 161A may contact the corresponding first channel structure 120A and the second channel contact 161B may contact the corresponding second channel structure 120B. The first channel contact 161A and the second channel contact 161B that form each of the plurality of pairs may be arranged in a diagonal direction DR4 between the first direction DR1 and the second direction DR2.

Hereinafter, an embodiment in which the plurality of channel structures 120A and 120B are connected to the plurality of bit lines BL via the plurality of channel contacts 161A and 161B and the plurality of bit line contacts 177A and 177B will be described. However, embodiments of the present disclosure are not limited thereto. For example, the plurality of channel contacts 161A and 161B may be omitted in some embodiments. According to an embodiment in which the plurality of channel contacts 161A and 161B are omitted, the first bit line contact 177A may contact the corresponding first channel structure 120A and the second bit line contact 177B may contact the corresponding second channel structure 120B.

The plurality of bit lines BL may extend in parallel to each other and include a conductive material. The plurality of bit lines BL may be spaced apart from each other in the first direction DR1 and may extend in the second direction DR2. Two or more bit lines BL may overlap with the first channel structure 120A and the second channel structure 120B of each of the plurality of pairs and different bit lines may be connected to the first channel structure 120A and the second channel structure 120B of each of the plurality of pairs. According to an embodiment, the plurality of bit lines BL may include a first bit line BL1 that is connected to the first channel structure 120A and a second bit line BL2 that is connected to the second channel structure 120B of the first channel structure 120A and the second channel structure 120B of each of the plurality of pairs. The first bit line contact 177A and the second bit line contact 177B of each of the plurality of pairs may be connected to the corresponding first bit line BL1 and the corresponding second bit line BL2, respectively.

According to the above-described structure, one of the first channel structure 120A and the second channel structure 120B that form a pair may be selected by selecting one of the plurality of conductive layers 115 and one of the first bit line BL1 and the second bit line BL2.

Figure 6A:
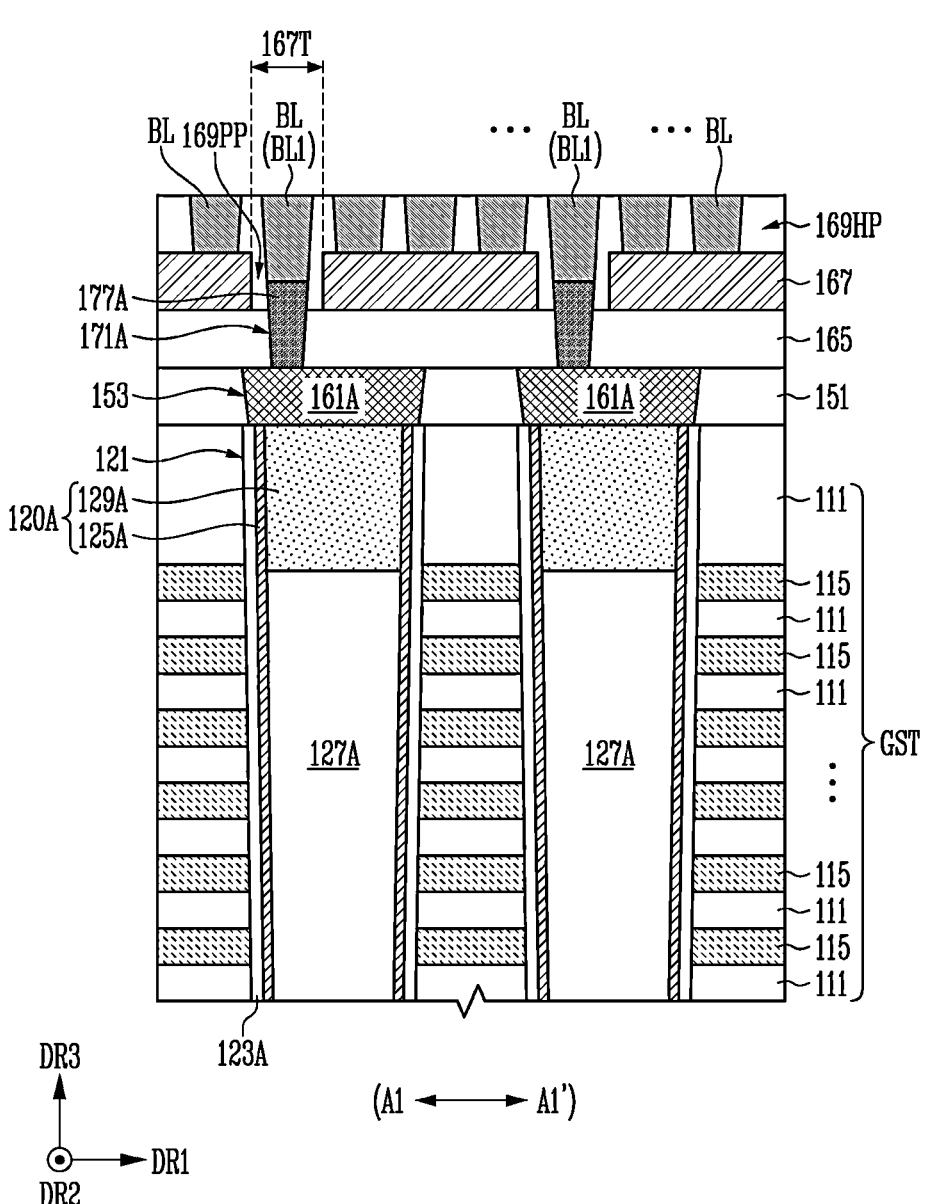
FIGS. 6A, 6B, and 6C are cross-sectional diagrams of a semiconductor memory device which are taken along lines A1-A1', B1-B1', and C1-C1' of FIG. 5, respectively.
Figure 6B:
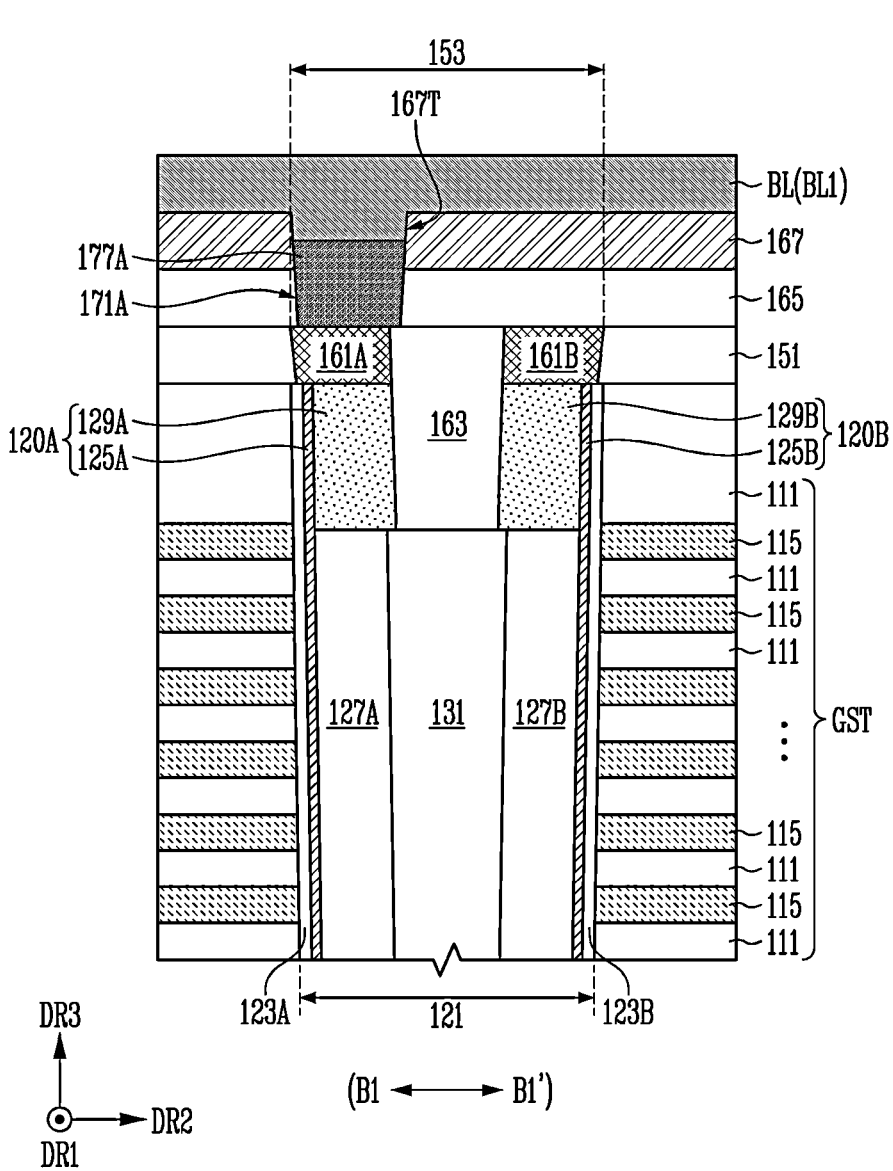
Figure 6C:
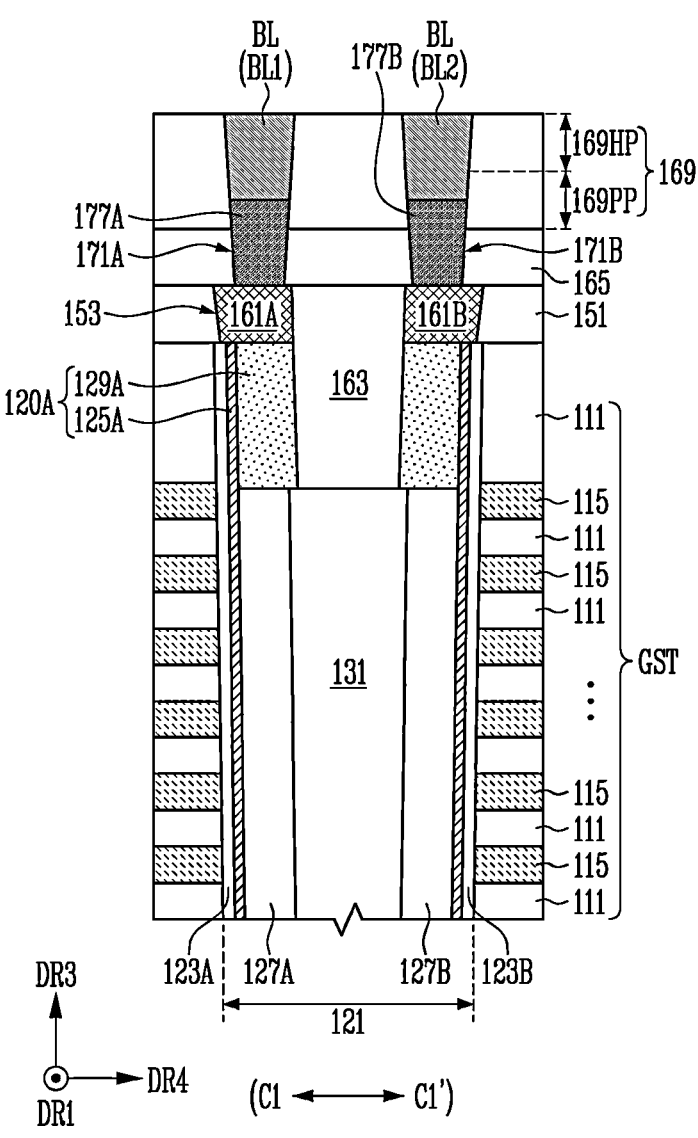

FIGS. 6A, 6B, and 6C are cross-sectional diagrams of a semiconductor memory device which are taken along lines A1-A1', B1-B1', and C1-C1' of FIG. 5, respectively.

Referring to FIGS. 4, 5, 6A, 6B, and 6C, the gate stacked structure GST may include a plurality of interlayer insulating layers 111 that are stacked alternately with the plurality of conductive layers 115 in the third direction DR3. The plurality of interlayer insulating layers 111 may include an insulating material such as a silicon oxide.

The channel hole 121 may extend in the third direction DR3 to pass through the plurality of interlayer insulating layers 111 and the plurality of conductive layers 115. The channel hole 121 may be divided into a first region and a second region with a vertical insulating structure interposed therebetween. According to an embodiment, a first vertical insulating structure 131 and a second vertical insulating structure 163 may be disposed in a central region of the channel hole 121. The second vertical insulating structure 163 may be disposed over the first vertical insulating structure 131.

The first channel structure 120A and the second channel structure 120B of each of the plurality of pairs may be disposed in the first region and the second region of the channel hole 121, respectively, with the first and second vertical insulating structures 131 and 163 interposed therebetween. Each of the first channel structure 120A and the second channel structure 120B may include a channel layer 125A or 125B and a capping doped semiconductor layer 129A or 129B.

A first channel layer 125A of the first channel structure 120A may extend in the third direction DR3 along an inner wall of the first memory layer 123A and a second channel layer 125B of the second channel structure 120B may extend in the third direction DR3 along an inner wall of the second memory layer 123B. The first channel layer 125A and the second channel layer 125B may include a semiconductor material such as silicon or germanium. The first channel layer 125A and the second channel layer 125B may be separated from each other by the first vertical insulating structure 131. The semiconductor memory device may further include a first core insulating layer 127A between the first channel layer 125A and the first vertical insulating structure 131 and a second core insulating layer 127B between the second channel layer 125B and the first vertical insulating structure 131. Each of the first vertical insulating structure 131, the first core insulating layer 127A, and the second core insulating layer 127B may have a height that defines an opening of an upper end of the channel hole 121.

A first capping doped semiconductor layer 129A of the first channel structure 120A, a second capping doped semiconductor layer 129B of the second channel structure 120B, and the second vertical insulating structure 163 may be disposed at the upper end of the channel hole 121. The first capping doped semiconductor layer 129A may be disposed over the first core insulating layer 127A and the second capping doped semiconductor layer 129B may be disposed over the second core insulating layer 127B. The first capping doped semiconductor layer 129A and the second capping doped semiconductor layer 129B may be separated from each other by the second vertical insulating structure 163.

The first channel layer 125A may extend between the first memory layer 123A and the first capping doped semiconductor layer 129A and contact the first capping doped semiconductor layer 129A. The second channel layer 125B may extend between the second memory layer 123B and the second capping doped semiconductor layer 129B and contact the second capping doped semiconductor layer 129B.

The first capping doped semiconductor layer 129A and the second capping doped semiconductor layer 129B may include a semiconductor material including at least one of an n-type impurity and a p-type impurity. According to an embodiment, the first capping doped semiconductor layer 129A and the second capping doped semiconductor layer 129B may include an n-type impurity as a majority carrier.

Ends of the first channel layer 125A and the second channel layer 125B that are respectively adjacent to the first capping doped semiconductor layer 129A and the second capping doped semiconductor layer 129B may be respectively doped with the same impurity as the first capping doped semiconductor layer 129A and the second capping doped semiconductor layer 129B.

At least one insulating layer and an etch stop layer 167 may be disposed between the gate stacked structure GST and the plurality of bit lines BL. According to an embodiment, a first insulating layer 165 may be disposed over the gate stacked structure GST and the etch stop layer 167 may be disposed over the first insulating layer 165. In addition, an interposing insulating layer 151 may be disposed between the first insulating layer 165 and the gate stacked structure GST.

The interposing insulating layer 151 may include a plurality of channel contact holes 153. The plurality of channel contact holes 153 may correspond to the plurality of channel holes 121 in a one-to-one manner. The plurality of pairs of the first channel contact 161A and the second channel contact 161B may correspond to the plurality of channel contact holes 153 in a one-to-one manner. The first channel contact 161A and the second channel contact 161B of each of the plurality of pairs may be arranged to be spaced apart from each other in the second direction DR2 in the corresponding channel contact hole 153. The channel contact hole 153 may extend to overlap with the corresponding pair of the first channel structure 120A and the second channel structure 120B. The first channel contact 161A and the second channel contact 161B of each of the plurality of pairs may be arranged to be spaced apart from each other in the second direction DR2 in the corresponding channel contact hole 153. The second vertical insulating structure 163 may extend into a part of the channel contact hole 153 which is between the first channel contact 161A and the second channel contact 161B.

The etch stop layer 167 may include a plurality of trenches 167T that extend in the diagonal direction DR4 and are parallel to each other. Each of the plurality of trenches 167T may overlap with two or more pairs of the first channel structure 120A and the second channel structure 120B that are arranged in the diagonal direction DR4 and two or more pairs of the first channel contact 161A and the second channel contact 161B corresponding to the two or more pairs of the first and second channel structures 120A and 120B.

The plurality of bit lines BL may be disposed in a second insulating layer 169. The second insulating layer 169 may include a horizontal portion 169HP over the etch stop layer 167 and a plurality of protrusions 169PP that extend into the plurality of trenches 167T from the horizontal portion 169HP. Each of the plurality of bit lines BL may overlap with two or more pairs of the first channel structure 120A and the second channel structure 120B that are arranged in the second direction DR2 and two or more pairs of the first channel contact 161A and the second channel contact 161B corresponding to the two or more pairs of the first and second channel structures 120A and 120B.

The first bit line BL1 and the second bit line BL2 may overlap with the first channel structure 120A and the second channel structure 120B of each of the plurality of pairs and the first channel contact 161A and the second channel contact 161B of a pair corresponding to each of the plurality of pairs of the first and the second channel structures 120A and 120B. Each of the plurality of trenches 167T may include a part that overlaps with the first bit line BL1 and the second bit line BL2. A first bit line contact hole 171A may be disposed in an overlapping part of the first bit line BL1 and the trench 167T corresponding thereto and a second bit line contact hole 171B may be disposed in an overlapping part of the second bit line BL2 and the trench 167T corresponding thereto. The first bit line contact hole 171A and the second bit line contact hole 171B may pass through the first insulating layer 165. The first bit line contact 177A and the second bit line contact 177B may be disposed in the first bit line contact hole 171A and the second bit line contact hole 171B, respectively.

The first bit line contact 177A may extend towards the first channel structure 120A from the first bit line BL1 and may be connected to the first channel contact 161A. The second bit line contact 177B may extend towards the second channel structure 120B from the second bit line BL2 and may be connected to the second channel contact 161B.

The protrusion 169PP of the second insulating layer 169 may include a part interposed between the first bit line contact 177A and the second bit line contact 177B and a part interposed between the first bit line BL1 and the second bit line BL2.

The etch stop layer 167 may serve as an etching barrier when an etching process for forming the first bit line contact hole 171A at the overlapping part of the trench 167T and the first bit line BL1 and the second bit line contact hole 171B at the overlapping part of the trench 167T and the second bit line BL2 is performed. To serve as the etching barrier, the etch stop layer 167 may include an insulating material having etch selectivity with respect to the first insulating layer 165 and the second insulating layer 169. According to an embodiment, the etch stop layer 167 may include a silicon nitride and the first insulating layer 165 and the second insulating layer 169 may include a silicon oxide. A silicon nitride has higher relative dielectric constant than a silicon oxide. According to an embodiment, the second insulating layer 169, which has relatively lower relative dielectric constant, may be disposed in the trench 167T of the etch stop layer 167. Accordingly, according to an embodiment, parasitic capacitance between the first bit line BL1 and the second bit line BL2, between the first bit line contact 177A and the second bit line contact 177B, between the first bit line BL1 and the second bit line contact 177B, and between the second bit line BL2 and the first bit line contact 177A may be decreased as compared to an embodiment in which the trench 167T is excluded from the etch stop layer 167.

Figure 7A:
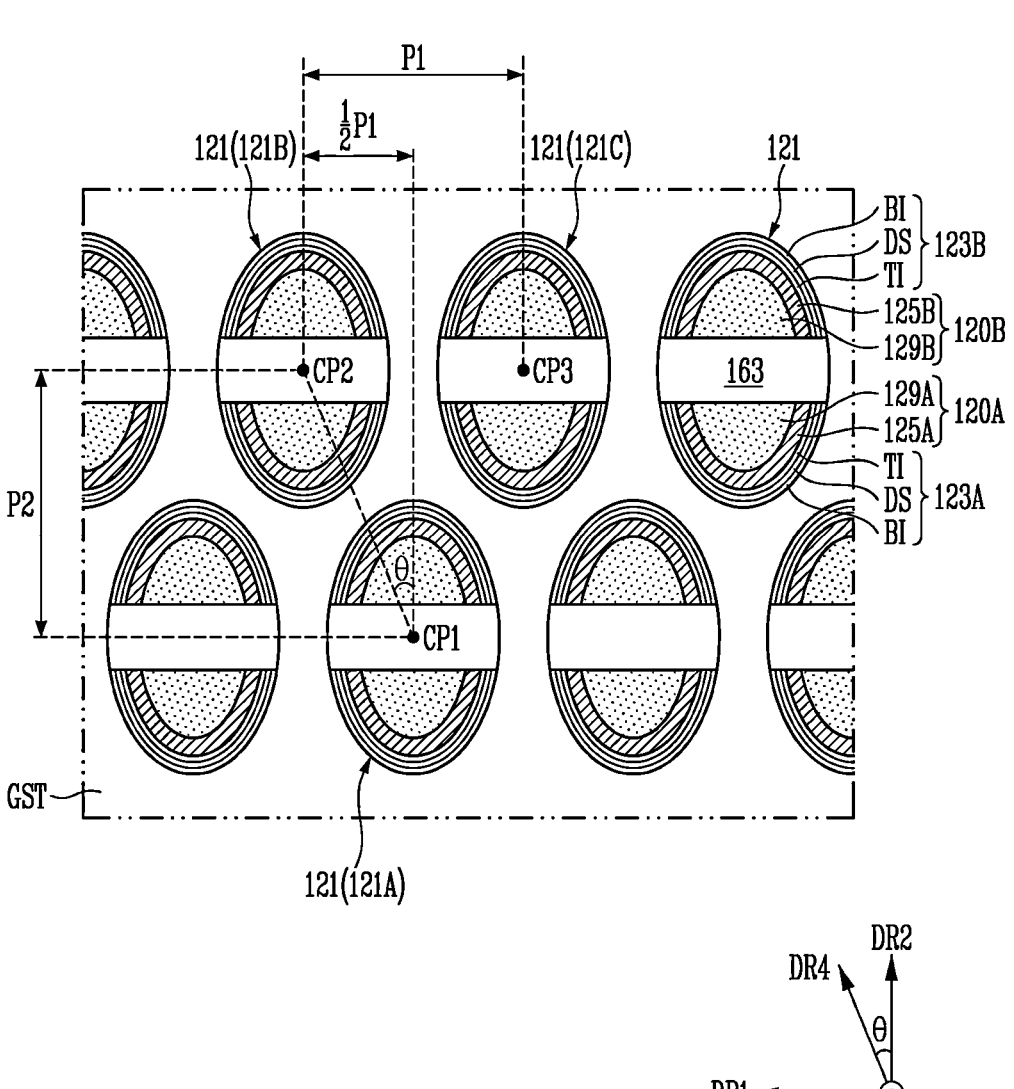
FIGS. 7A, 7B, and 7C are plan views illustrating layouts of a semiconductor memory device shown in FIG. 4 at different depths.
Figure 7B:
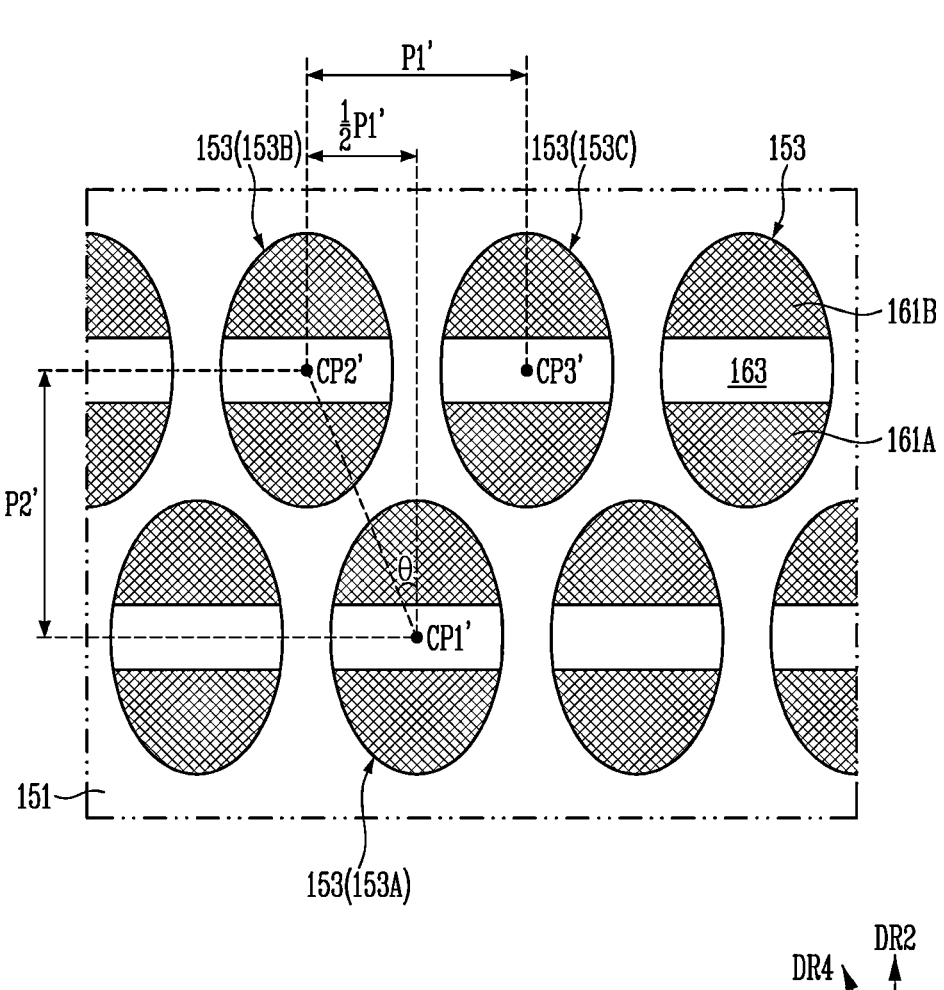
Figure 7B:
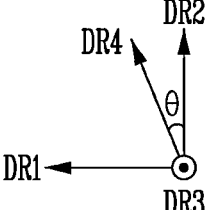
Figure 7C:
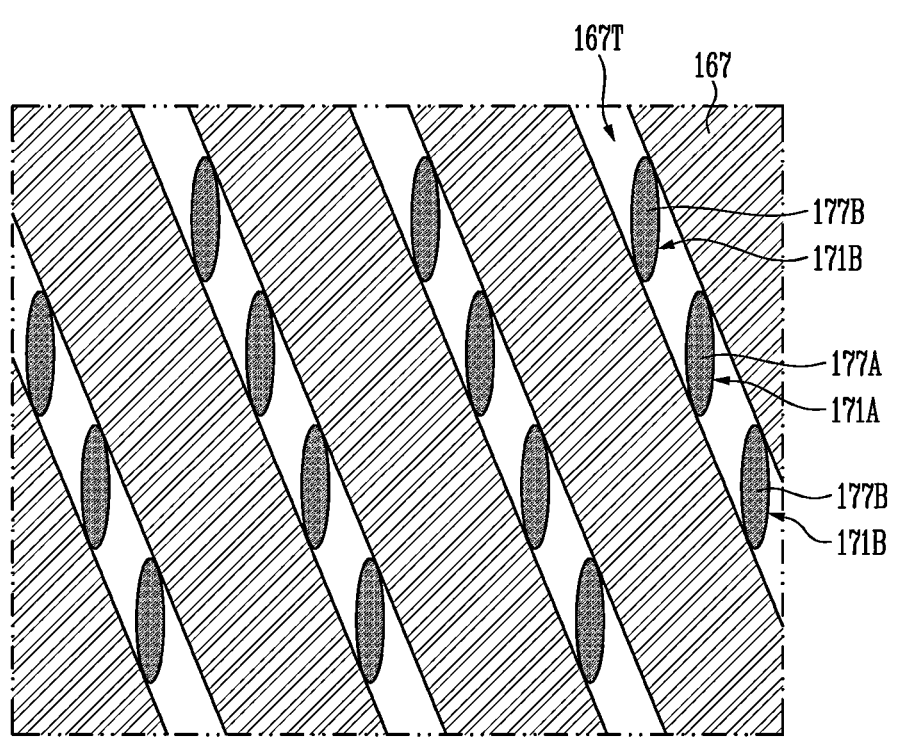
Figure 7C:
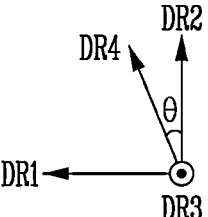

FIGS. 7A, 7B, and 7C are plan views illustrating layouts of a semiconductor memory device shown in FIG. 4 at different depths.

FIG. 7A illustrates a layout of the plurality of channel holes 121 in the same plane.

Referring to FIG. 7A, the plurality of channel holes 121 may be arranged in a plurality of rows and the plurality of channel holes 121 of each row may be arranged in the first direction DR1. The plurality of channel holes 121 in neighboring rows may be arranged such that central regions of the plurality of channel holes 121 in a row are not aligned with central regions of the plurality of channel holes 121 in a neighboring row. Central regions of the plurality of channel holes 121 in the same row may be arranged in a line extending in the first direction DR1.

Arrangement pitch P1 of the plurality of channel holes 121 in the first direction DR1 and arrangement pitch P2 of the plurality of channel holes 121 in the second direction DR2 may be designed such that θ in [Equation 1] below has a value between 10° and 45° considering alignment margins and integration density of the first bit line contact holes 171A and the second bit line contact holes 171B shown in FIG. 7C.

$$\theta = \tan^{-1}\left[\frac{(1/2)P1}{P2}\right]$$ [Equation 1]

The plurality of channel holes 121 may include a first channel hole 121A in a first row and a second channel hole 121B and a third channel hole 121C in a second row that are adjacent to the first channel hole 121A. The second channel hole 121B and the third channel hole 121C may be defined to be adjacent to each other in the first direction DR1. A center point CP1 of the first channel hole 121A may be disposed in the first row at a position corresponding to the center of a connection line between a center point CP2 of the second channel hole 121B and a center point CP3 of the third channel hole 121C.

The second vertical insulating structure 163 may extend between the first memory layer 123A and the second memory layer 123B from between the first channel structure 120A and the second channel structure 120B. Similarly, the first vertical insulating structure 131 shown in FIGS. 6B and 6C may extend between the first memory layer 123A and the second memory layer 123B from between the first channel structure 120A and the second channel structure 120B. Each of the first memory layer 123A and the second memory layer 123B may include a tunnel insulating layer TI between the corresponding channel structure and the gate stacked structure GST, a data storage layer DS between the tunnel insulating layer TI and the gate stacked structure GST, and a blocking insulating layer BI between the data storage layer DS and the gate stacked structure GST. The data storage layer DS may include a material layer capable of storing data changed by using Fowler-Nordheim tunneling. The data storage layer DS may include various materials, for example, a charge trap layer. The charge trap layer may include a silicon nitride layer. However, embodiments of the present disclosure are not limited thereto, and the data storage layer DS may include a phase-change material, nanodots, or the like. The blocking insulating layer BI may include an insulating material capable of blocking charges. The tunnel insulating layer TI may include a silicon oxide layer enabling charge tunneling.

FIG. 7B is a diagram illustrating a layout of the plurality of channel contact holes 153 in the same plane.

Referring to FIG. 7B, the plurality of channel contact holes 153 may be arranged in a plurality of rows in the same manner as the plurality of channel holes 121 shown in FIG. 7A. For example, respective center points CP1', CP2', and CP3' of a first channel contact hole 153A, a second channel contact hole 153B, and a third channel contact hole 153C that neighbor each other may be arranged in the same manner as the center points of the first, second, and third channel holes 121A, 121B, and 121C shown in FIG. 7A.

Arrangement pitch P1' of the plurality of channel contact holes 153 in the first direction DR1 and arrangement pitch P2' of the plurality of channel contact holes 153 in the second direction DR2 may be designed such that θ in [Equation 2] below has a value between 10° and 45° considering alignment margins and integration density of the first bit line contact holes 171A and the second bit line contact holes 171B shown in FIG. 7C.

$$\theta = \tan^{-1}\left[\frac{(1/2)P1'}{P2'}\right]$$ [Equation 2]

A value of θ in each of [Equation 1] and [Equation 2] respectively described with reference to FIGS. 7A and 7B may correspond to an angle that is formed by an axis along the second direction DR2 and an axis along the diagonal direction DR4.

FIG. 7C is a diagram illustrating a layout of the trenches 167T of the etch stop layer 167, the first bit line contacts 177A, and the second bit line contacts 177B in the same plane.

Referring to FIG. 7C, the diagonal direction DR4 may be a direction in which the trench 167T extends, the first bit line contacts 177A and the second bit line contacts 1778 are arranged, and the first bit line contact holes 171A and the second bit line contact holes 1718 are arranged.

However, the direction in which the trench 167T extends is not limited to the diagonal direction DR4 and may be changed.

Figure 8:
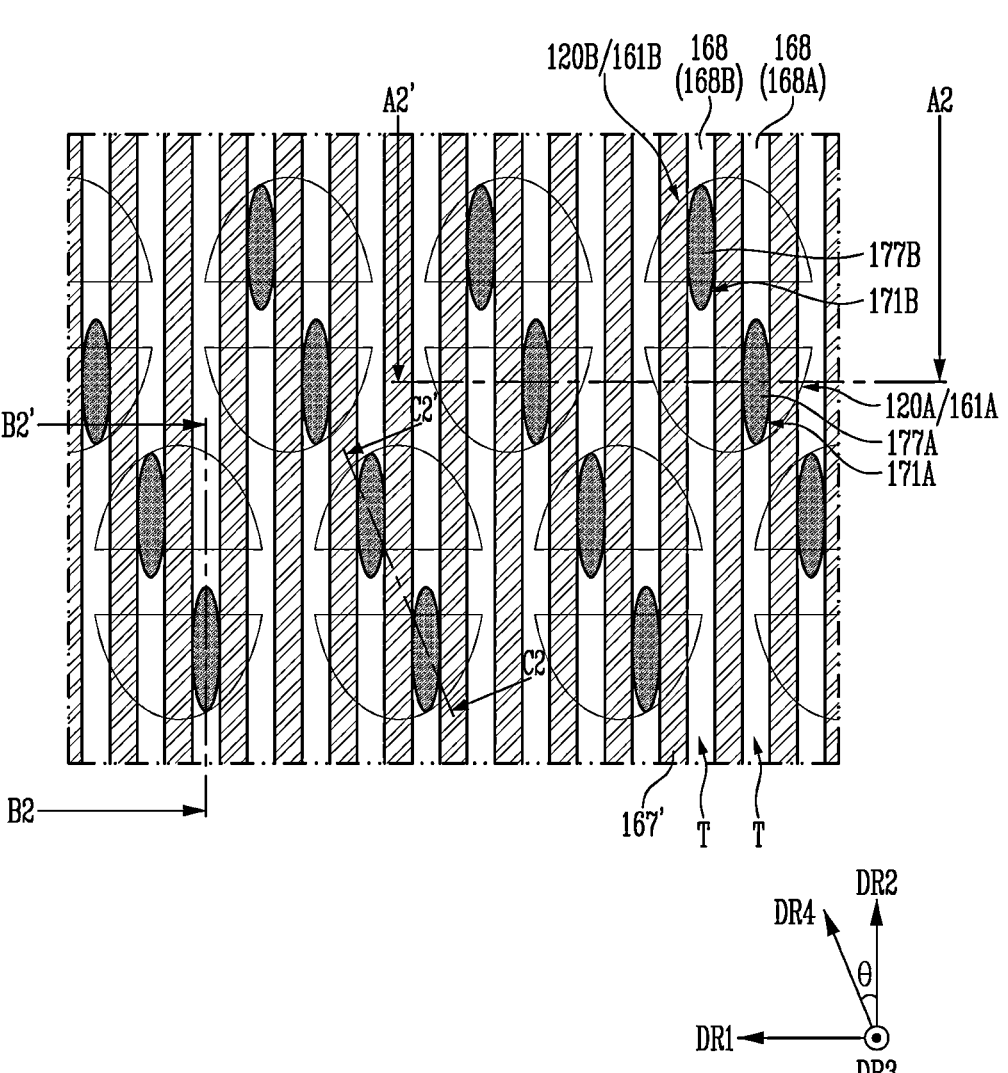
FIG. 8 is a plan view illustrating an arrangement of an etch stop layer and a plurality of bit line contacts of a semiconductor memory device according to an embodiment.

FIG. 8 is a plan view illustrating an arrangement of an etch stop layer and a plurality of bit line contacts of a semiconductor memory device according to an embodiment. Hereinafter, a detailed description of components already described in the embodiments shown in FIGS. 4 to 7C will be omitted for the sake of brevity.

Referring to FIG. 8, an etch stop layer 167' may extend in the second direction DR2 and may be penetrated by a plurality of trenches T that are parallel to each other. The first bit line contact 177A and the second bit line contact 1778 of each of the plurality of pairs may be respectively disposed in the trenches T that neighbor each other in the first direction DR1. The first bit line contact hole 171A and the second bit line contact hole 1718 of each of the plurality of pairs may also be respectively disposed in the trenches T that neighbor each other in the first direction DR1. The first bit line contact 177A and the second bit line contact 177B may be aligned with each other in the diagonal direction DR4. An angle (θ) that is formed by an axis extending in the diagonal direction DR4 and an axis extending in the second direction DR2 may be between 10° and 45° as described above with reference to FIGS. 7A, 7B, and 7C.

A plurality of insulating lines 168 may be respectively disposed in the plurality of trenches T. The plurality of insulating lines 168 may include a first insulating line 168A and a second insulating line 168B that neighbor each other in the first direction DR1. The first insulating line 168A and the second insulating line 168B may extend in the second direction DR2 to overlap with the first channel structure 120A and the second channel structure 120B that form a pair and the first channel contact 161A and the second channel contact 161B that form a pair.

The first bit line contact 177A may pass through the first insulating line 168A in an overlapping part of the first insulating line 168A and the first channel structure 120A. The second bit line contact 177B may pass through the second insulating line 168B in an overlapping part of the second insulating line 168B and the second channel structure 120B.

Figure 9A:
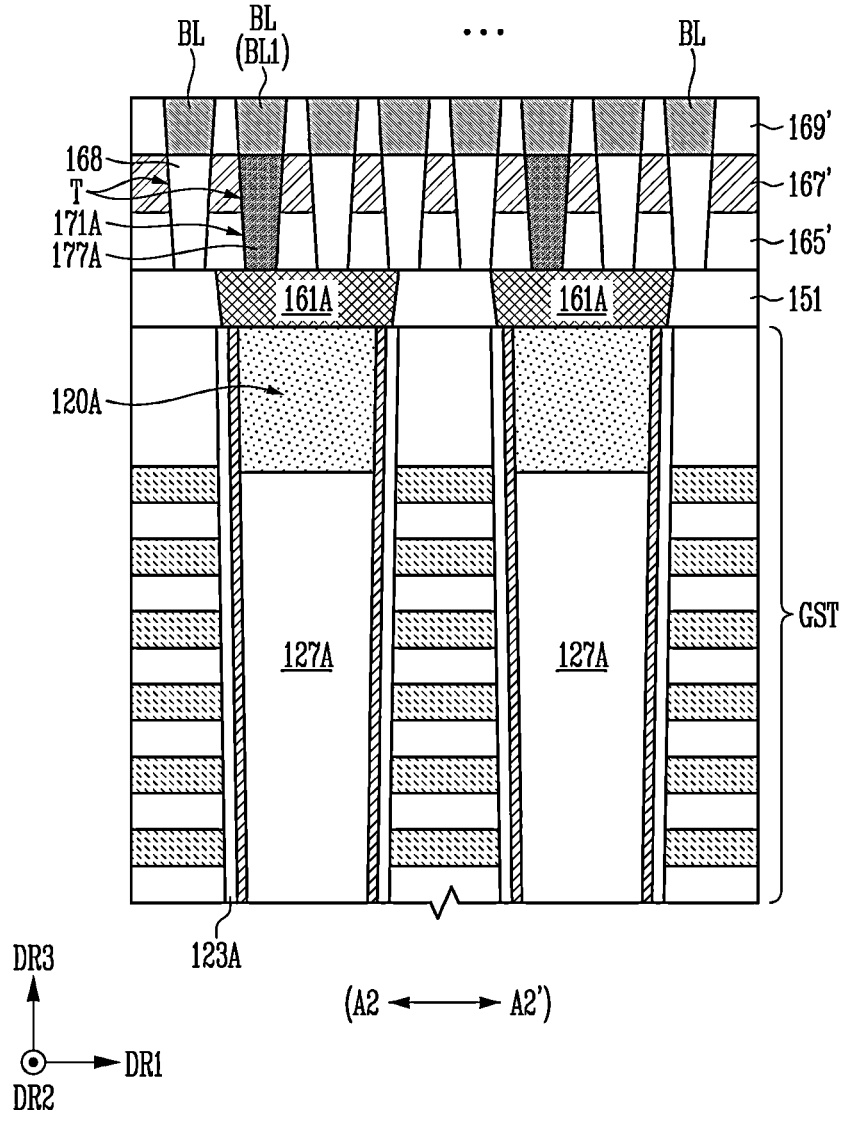
FIGS. 9A, 9B, and 9C are cross-sectional diagrams of a semiconductor memory device which are taken along lines A2-A2', B2-B2', and C2-C2' of FIG. 8, respectively.
Figure 9B:
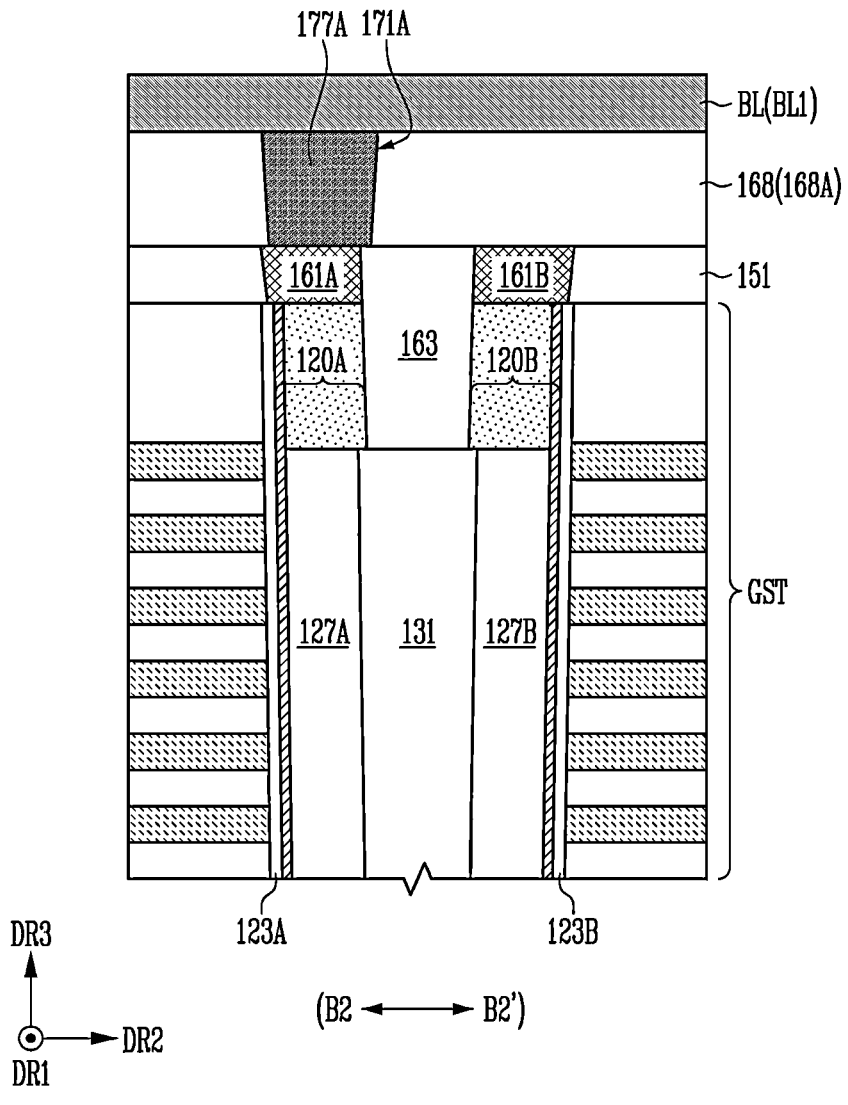
Figure 9C:
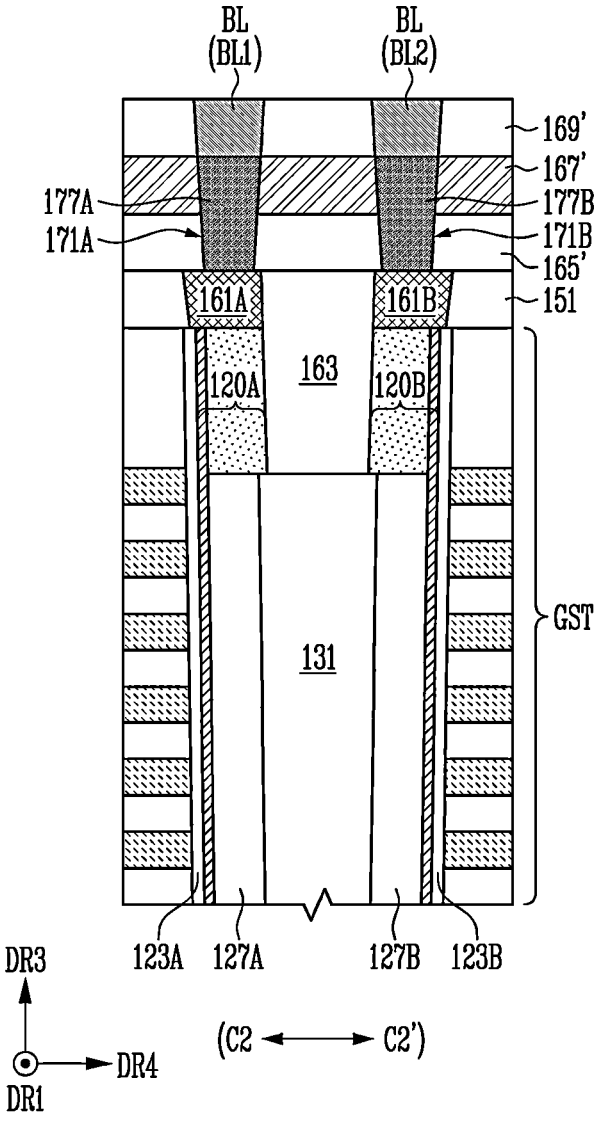

FIGS. 9A, 9B, and 9C are cross-sectional diagrams of a semiconductor memory device which are taken along lines A2-A2', B2-B2', and C2-C2' of FIG. 8, respectively.

Referring to FIGS. 8, 9A, 9B, and 9C, the semiconductor memory device may include the gate stacked structure GST, the first channel structure 120A, the second channel structure 120B, the first memory layer 123A, the second memory layer 123B, the first core insulating layer 127A, the second core insulating layer 127B, the first vertical insulating structure 131, the second vertical insulating structure 163, and the interposing insulating layer 151 as described above with reference to FIGS. 5, 6A, 6B, and 6C. A first insulating layer 165' may be disposed over the interposing insulating layer 151.

The plurality of trenches T may pass through not only the etch stop layer 167' but also the first insulating layer 165'. According to the above-described structure, the plurality of insulating lines 168 may be regarded as passing through not only the etch stop layer 167' but also the first insulating layer 165'.

The first bit line contact hole 171A and the first bit line contact 177A corresponding to the first insulating line 168A may pass through the first insulating line 168A and the first insulating layer 165' in an overlapping part of the first channel structure 120A and the first insulating line 168A. The second bit line contact hole 171B and the second bit line contact 177B corresponding to the second insulating line 168B may pass through the second insulating line 168B and the first insulating layer 165' in an overlapping part of the second channel structure 120B and the second insulating line 168B.

The plurality of bit lines BL may be respectively disposed over the plurality of the insulating lines 168. The plurality of bit lines BL may include the first bit line BL1 coupled to the first bit line contact 177A and the second bit line BL2 coupled to the second bit line contact 177B.

The etch stop layer 167' may include an insulating material having etch selectivity with respect to the first insulating layer 165', the plurality of insulating lines 168, and a second insulating layer 169'. As described above with reference to FIGS. 5, 6A, 6B, and 6C, the etch stop layer 167' may include a silicon nitride such that the etch stop layer 167' serves as an etching barrier when an etching process for forming the first bit line contact hole 171A and the second bit line contact hole 171B is performed. In an embodiment, the first insulating layer 165', the plurality of insulating lines 168, and the second insulating layer 169' may include an insulating material having lower relative dielectric constant than the etch stop layer 167' such that parasitic capacitance is reduced as described above with reference to FIGS. 5, 6A, 6B, and 6C. According to an embodiment, the first insulating layer 165', the plurality of insulating lines 168, and the second insulating layer 169' may include a silicon oxide.

Figure 10A:
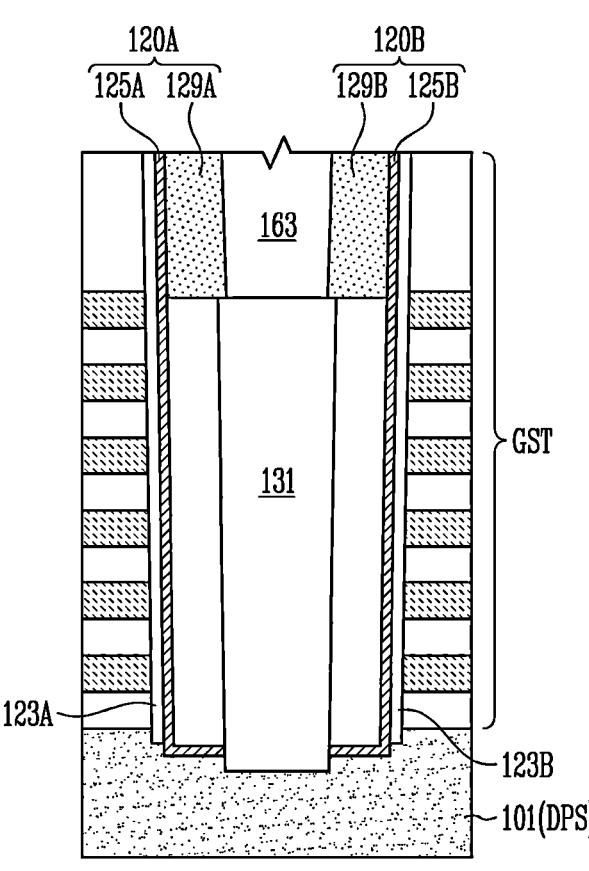
FIGS. 10A and 10B are cross-sectional diagrams illustrating a structure in which a doped semiconductor structure and a channel structure are coupled according to embodiments.
Figure 10B:
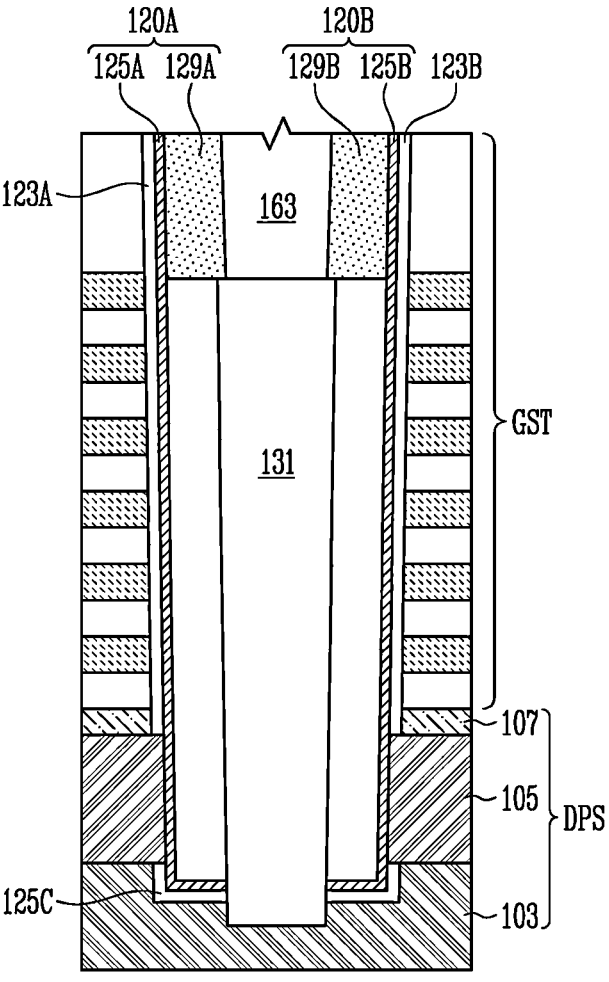

FIGS. 10A and 10B are cross-sectional diagrams illustrating a structure in which a doped semiconductor structure and a channel structure are coupled according to embodiments.

Referring to FIGS. 10A and 10B, the first channel layer 125A of the first channel structure 120A and the second channel layer 125B of the second channel structure 120B may contact the doped semiconductor structure DPS according to embodiments. The doped semiconductor structure DPS may overlap with the gate stacked structure GST. The first vertical insulating structure 131 may be disposed between the second vertical insulating structure 163 and the doped semiconductor structure DPS and may include a bottom surface that contacts the doped semiconductor structure DPS.

The doped semiconductor structure DPS may include at least one of an n-type impurity and a p-type impurity. According to an embodiment, the doped semiconductor structure DPS may include, as a majority carrier, an impurity of which a conductivity type is the same as that of an impurity in the first capping doped semiconductor layer 129A of the first channel structure 120A and in the second capping doped semiconductor layer 129B of the second channel structure 120B. According to another embodiment, the doped semiconductor structure DPS may include a region having an n-type impurity as a majority carrier and a region having a p-type impurity as a majority carrier.

The doped semiconductor structure DPS may contact the first channel layer 125A and the second channel layer 125B by various methods.

Referring to FIG. 10A, the doped semiconductor structure DPS may include at least one semiconductor layer. According to an embodiment, the doped semiconductor structure DPS may include a single semiconductor layer 101. The semiconductor layer 101 may be a monocrystalline semiconductor layer or a polycrystalline semiconductor layer.

The first channel layer 125A and the second channel layer 125B may extend into the doped semiconductor structure DPS and may each include a bottom surface that contacts the doped semiconductor structure DPS.

Referring to FIG. 10B, the doped semiconductor structure DPS may include two or more semiconductor layers. According to an embodiment, the doped semiconductor structure DPS may include a first semiconductor layer 103, a second semiconductor layer 105 over the first semiconductor layer 103, and a third semiconductor layer 107 over the second semiconductor layer 105.

The first channel layer 125A and the second channel layer 125B may pass through the third semiconductor layer 107 and may extend into the first semiconductor layer 103. The second semiconductor layer 105 may contact a part of a sidewall of each of the first channel layer 125A and the second channel layer 125B and extend between the first semiconductor layer 103 and the third semiconductor layer 107.

The first memory layer 123A or the second memory layer 123B may extend from between the corresponding channel layer 125A or 125B and the gate stacked structure GST to between the corresponding channel layer 125A or 125B and the third semiconductor layer 107. A lower memory layer 125C may be interposed between the first semiconductor layer 103 and each of the first channel layer 125A and the second channel layer 125B. The lower memory layer 125C may include the same material layers as the first memory layer 123A and the second memory layer 123B.

FIGS. 11A, 11B, 12A, 12B, 13A, 13B, 14A, 14B, 15A, and 15C are diagrams illustrating a method of manufacturing a semiconductor memory device according to an embodiment.

Figure 11A:
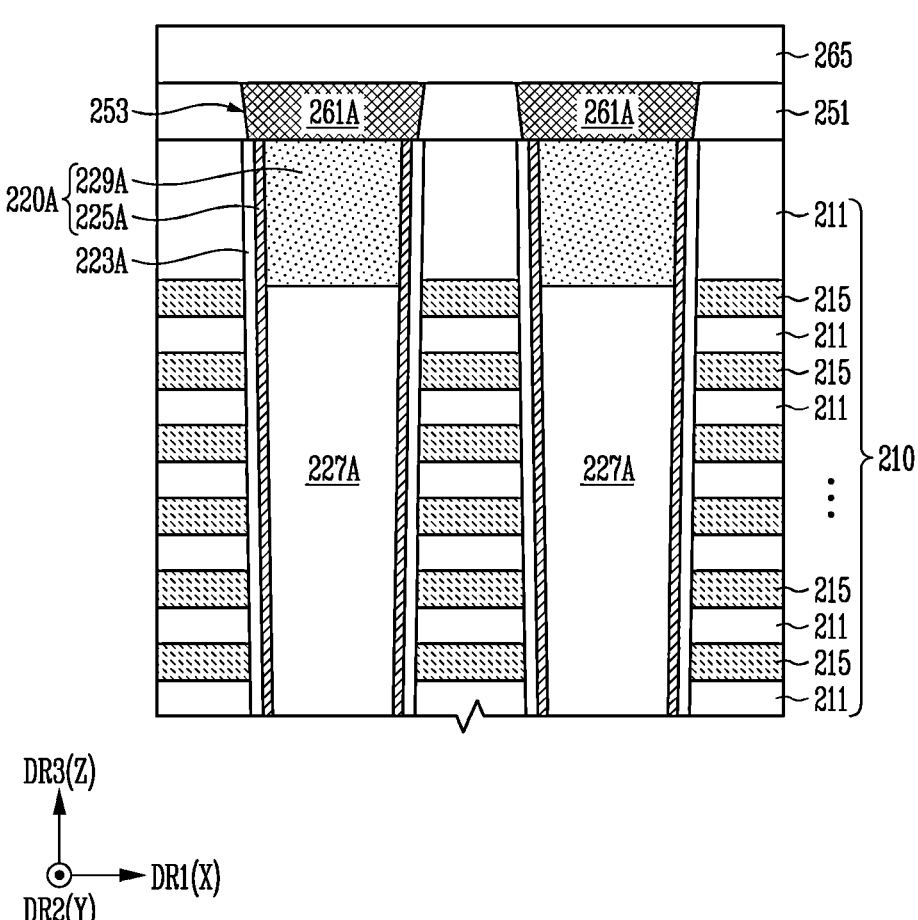
FIGS. 11A, 11B, 12A, 12B, 13A, 13B, 14A, 14B, 15A, and 15C are diagrams illustrating a method of manufacturing a semiconductor memory device according to an embodiment.
Figure 11B:
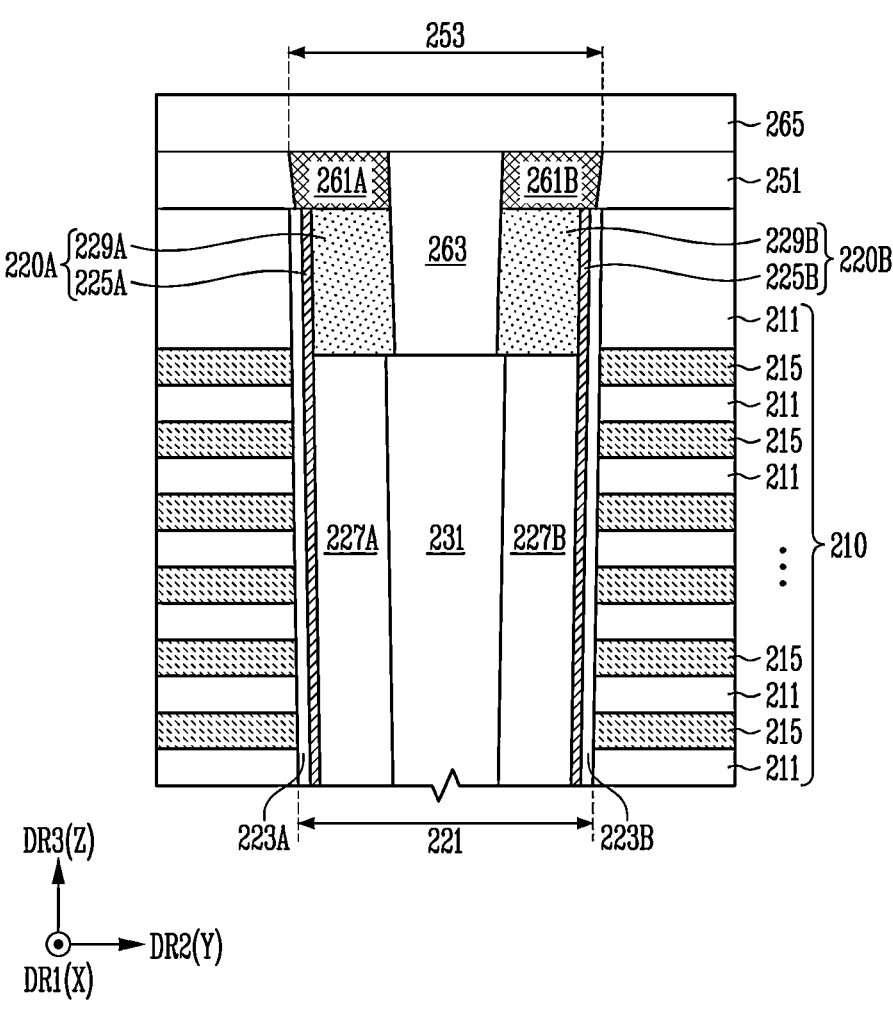

Referring to FIGS. 11A and 11B, a substrate (not shown) including various lower structures may be provided according to embodiments and a memory cell array structure may be formed over the substrate.

The memory cell array structure may include a gate stacked structure 210. The memory cell array structure may also include a first memory layer 223A, a second memory layer 223B, a first channel structure 220A, and a second channel structure 220B in a channel hole 221 that passes through the gate stacked structure 210. The gate stacked structure 210 may include a plurality of layers 211 and 215 having a plate shape that extends in the first direction DR1 and the second direction DR2. The plurality of layers 211 and 215 may include a plurality of interlayer insulating layers 211 and a plurality of conductive layers 215 that are disposed alternately with each other in the third direction DR3 as described above with reference to FIGS. 4, 6A, 6B, and 6C. A first core insulating layer 227A, a second core insulating layer 227B, a first vertical insulating structure 231, and a second vertical insulating structure 263 may be disposed in the channel hole 221.

Forming the above-described memory cell array structure may include forming the plurality of layers 211 and 215, forming the channel hole 221 that passes through the plurality of layers 211 and 215, forming a preliminary memory layer on a sidewall of the channel hole 221, forming a preliminary channel layer on the preliminary memory layer, forming a preliminary core insulating layer in a central region of the channel hole 221 that is opened by the preliminary channel layer, forming the first vertical insulating structure 231 that passes through the preliminary core insulating layer, replacing an upper part of the preliminary core insulating layer and an upper part of the first vertical insulating structure 231 by a preliminary capping doped semiconductor layer, and forming the second vertical insulating structure 263 that passes through the preliminary capping doped semiconductor layer.

The preliminary memory layer may include the blocking insulating layer BI, the data storage layer DS, and the tunnel insulating layer TI shown in FIG. 7A. The preliminary memory layer may be divided into the first memory layer 223A and the second memory layer 223B by the first vertical insulating structure 231.

The first vertical insulating structure 231 may divide the preliminary channel layer into a first channel layer 225A of the first channel structure 220A and a second channel layer 225B of the second channel structure 220B. The first vertical insulating structure 231 may divide the preliminary core insulating layer into the first core insulating layer 227A and the second core insulating layer 227B.

The second vertical insulating structure 263 may divide the preliminary capping doped semiconductor layer into a first capping doped semiconductor layer 229A of the first channel structure 220A and a second capping doped semiconductor layer 229B of the second channel structure 220B. Forming an interposing insulating layer 251 over the gate stacked structure 210, forming a channel contact hole 253 that passes through the interposing insulating layer 251, and forming a conductive material in the channel contact hole 253 may be performed before forming the second vertical insulating structure 263. The conductive material in the channel contact hole 253 may be divided into a first channel contact 261A and a second channel contact 261B by the second vertical insulating structure 263.

The channel hole 221, the first channel structure 220A, and the second channel structure 220B may be formed to correspond to the arrangement described above with reference to FIG. 7A and the channel contact hole 253, the first channel contact 261A, and the second channel contact 261B may be formed to correspond to the arrangement described above with reference to FIG. 7B.

Subsequently, a first insulating layer 265 may be formed over the interposing insulating layer 251.

Figure 12A:
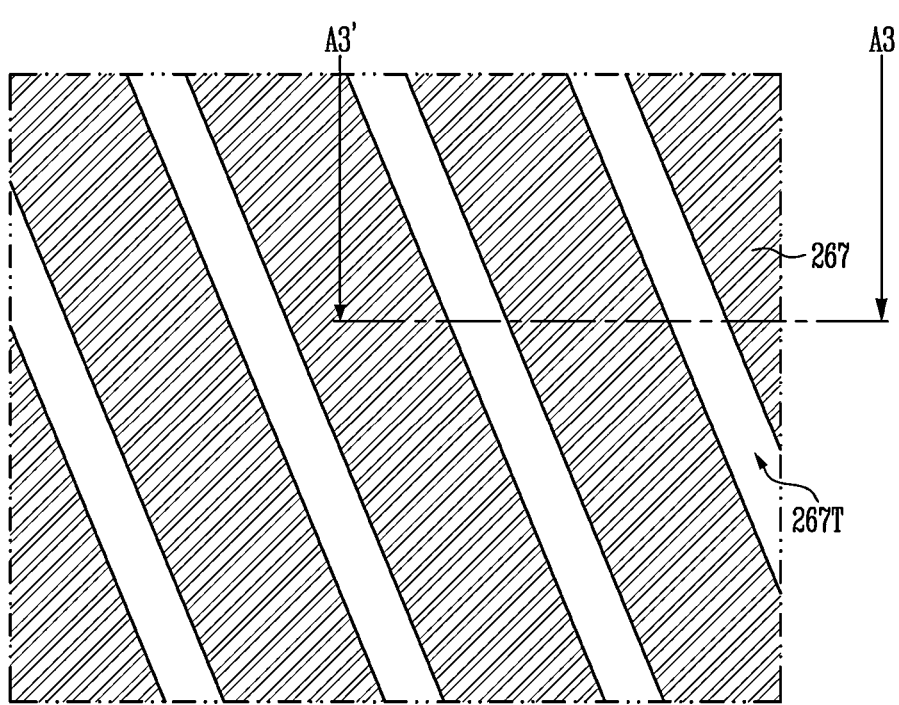
Figure 12A:
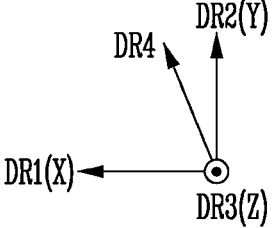
Figure 12B:
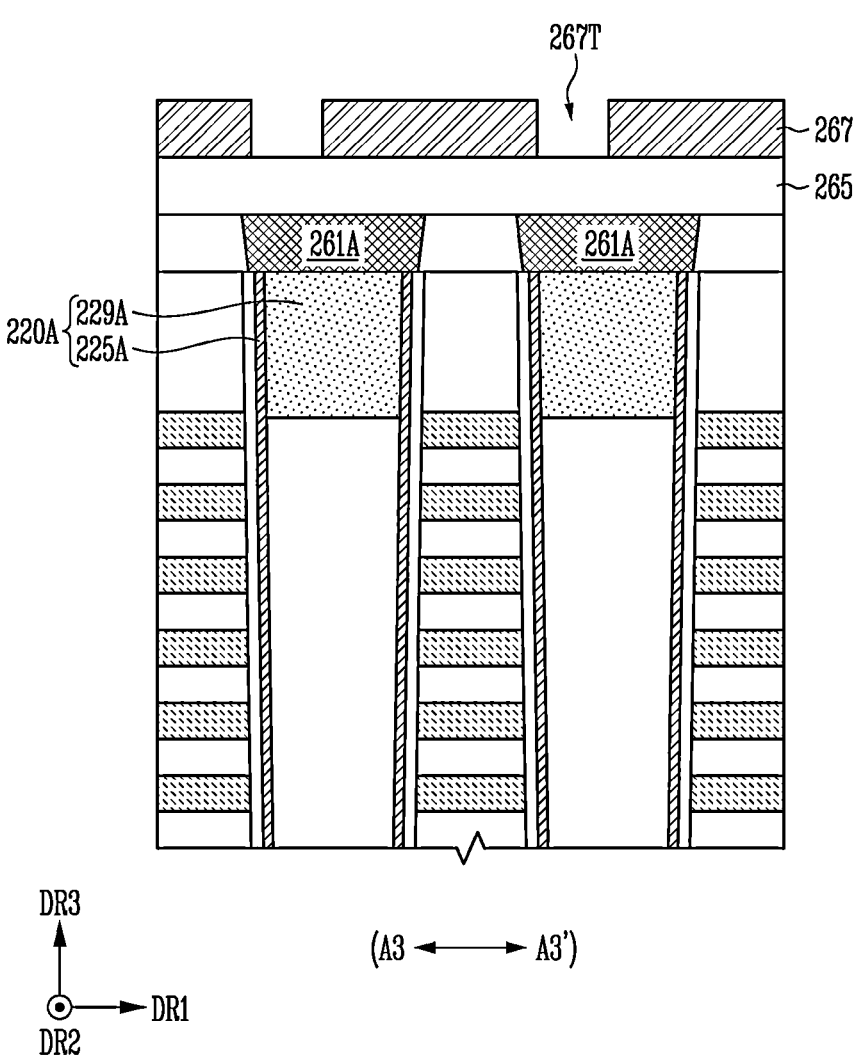

FIG. 12A is a plan view illustrating a step of forming an etch stop layer 267 that includes a first trench 267T and FIG. 12B is a cross-sectional diagram taken along line A3-A3' of FIG. 12A.

Referring to FIGS. 12A and 12B, the etch stop layer 267 may be formed over the first insulating layer 265. The etch stop layer 267 may include an insulating material having etch selectivity with respect to the first insulating layer 265. According to an embodiment, the first insulating layer 265 may include a silicon oxide and the etch stop layer 267 may include a silicon nitride.

Subsequently, the first trench 267T may be formed by etching the etch stop layer 267. The first trench 267T may extend in the diagonal direction DR4 between the first direction DR1 and the second direction DR2.

Figure 13A:
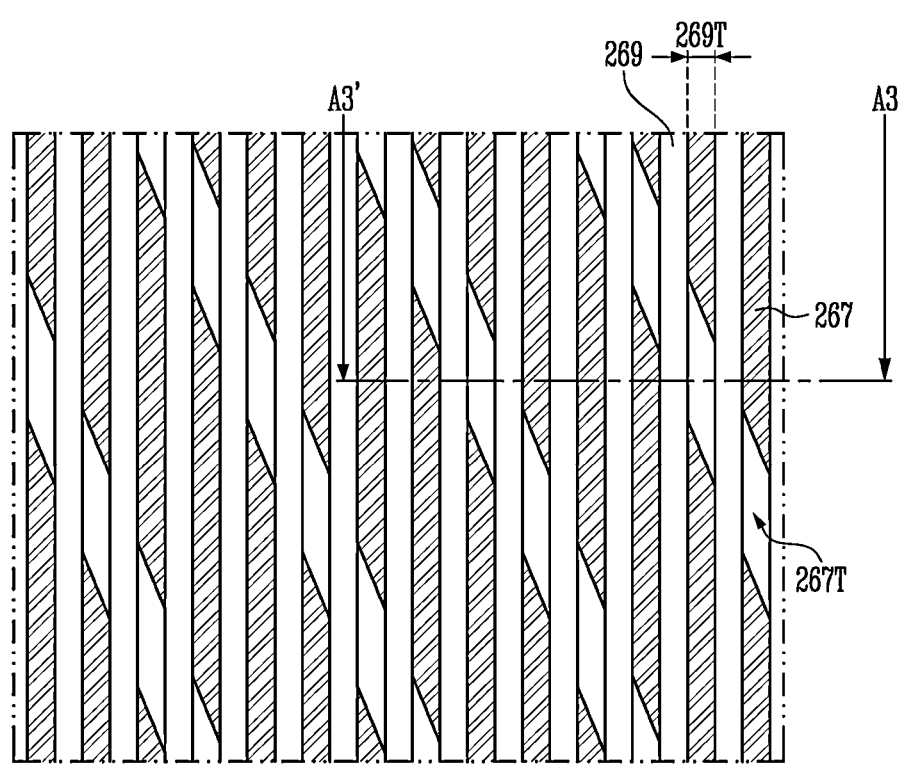
Figure 13A:
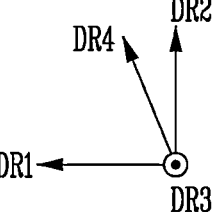
Figure 13B:
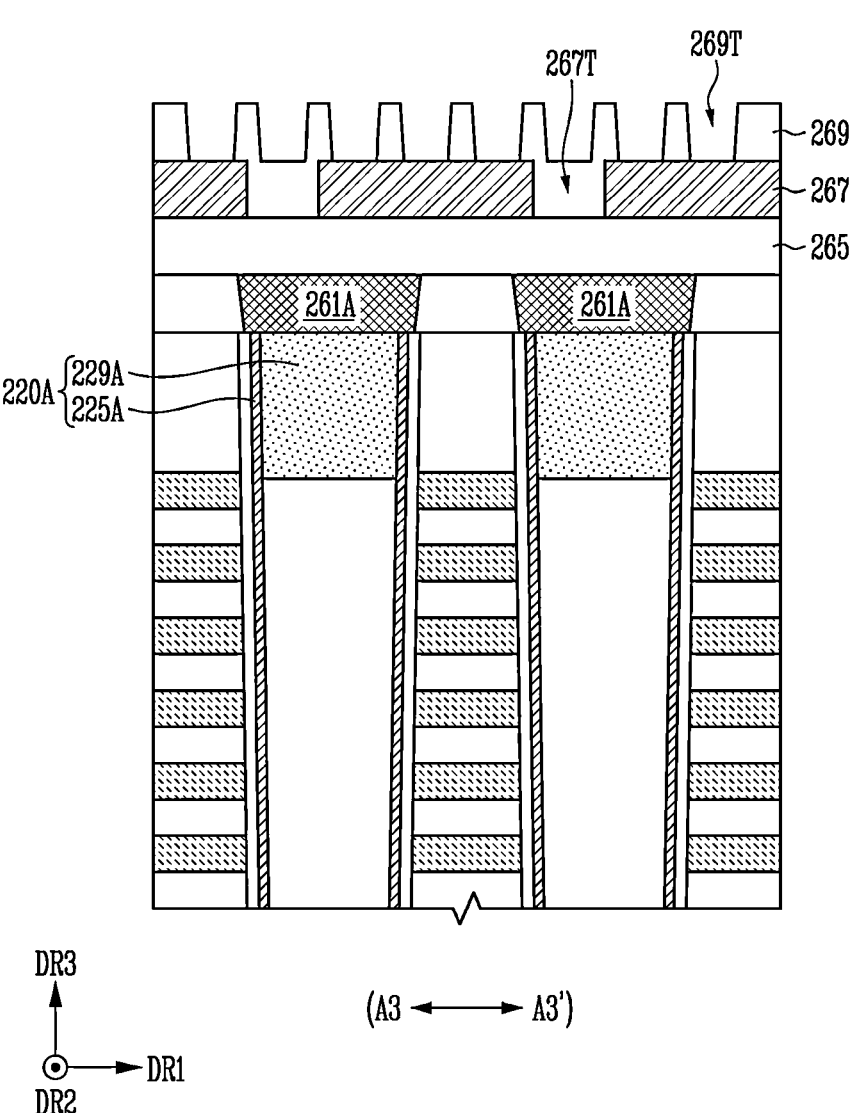

FIG. 13A is a plan view illustrating a step of forming a second insulating layer 269 that includes a plurality of second trenches 269T and FIG. 13B is a cross-sectional diagram taken along line A3-A3' of FIG. 13A.

Referring to FIGS. 13A and 13B, the second insulating layer 269 may be formed over the etch stop layer 267. The second insulating layer 269 may be formed to fill the first trench 267T. The second insulating layer 269 may include a different material from the etch stop layer 267 and include an insulating material that has lower relative dielectric constant than the etch stop layer 267. According to an embodiment, the second insulating layer 269 may include a silicon oxide.

Subsequently, the plurality of second trenches 269T extending in the second direction DR2 may be formed. The plurality of second trenches 269T may be disposed to be spaced apart from each other in the first direction DR1.

Each of the first trench 267T shown in FIGS. 12A and 12B and the plurality of second trenches 269T shown in FIGS. 13A and 13B may be formed by a photolithography process and an etching process that correspond to each of the first trench 267T and the plurality of second trenches 269T.

Figure 14A:
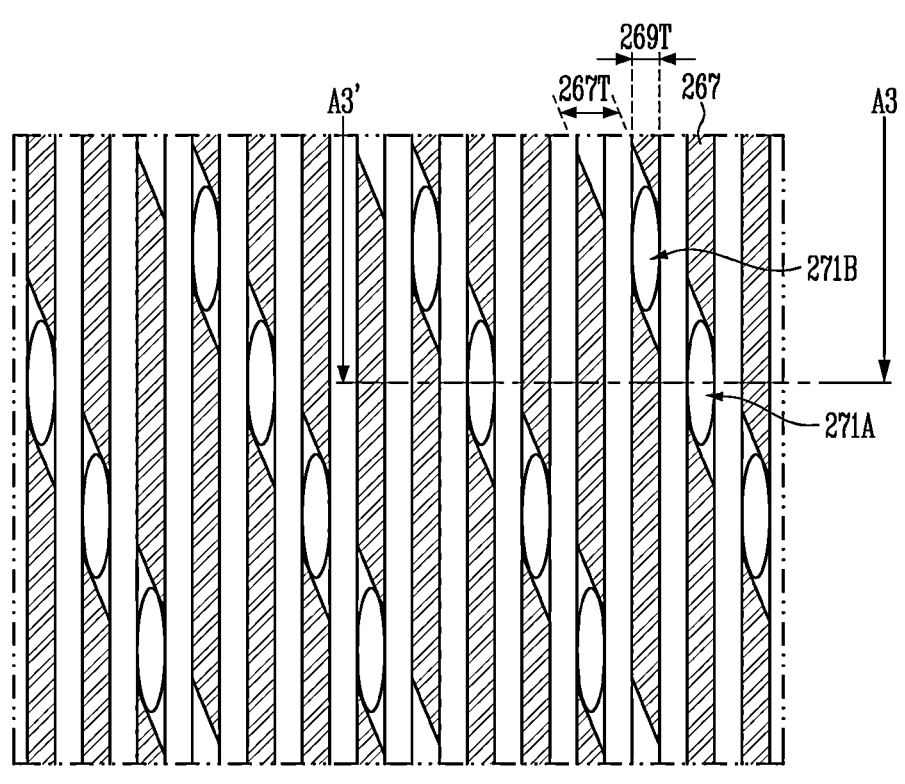
Figure 14A:
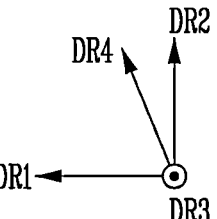
Figure 14B:
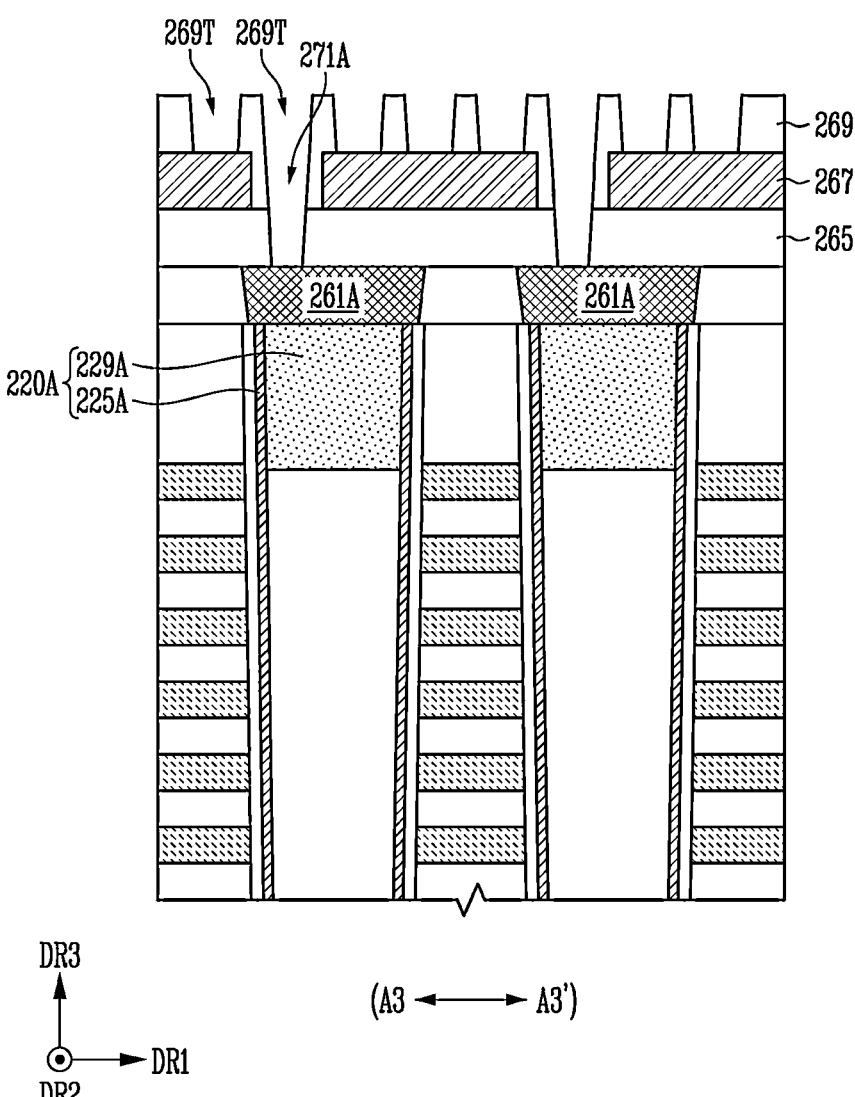

FIG. 14A is a plan view illustrating a step of forming a first bit line contact hole 271A and a second bit line contact hole 271B and FIG. 14B is a cross-sectional diagram taken along line A3-A3' of FIG. 14A.

Referring to FIGS. 14A and 14B, a part of the second insulating layer 269 in the first trench 267T may be exposed through overlapping parts of the first trench 267T and the plurality of second trenches 269T. An exposed region of the second insulating layer 269 may have a rhombus shape or a parallelogram shape.

Subsequently, the first bit line contact hole 271A and the second bit line contact hole 271B may be formed by etching the exposed region of the second insulating layer 269 and regions of the corresponding first insulating layer 265. The etch stop layer 267 may serve as an etching barrier when the first insulating layer 265 and the second insulating layer 269 are etched. Regions corresponding to edges of a rhombus or a parallelogram may be processed to be rounded due to the effect of etch bias when the first insulating layer 265 and the second insulating layer 269 are etched.

Each of the first bit line contact hole 271A and the second bit line contact hole 271B may overlap with a channel structure corresponding thereto and expose a channel contact corresponding thereto. For example, the first bit line contact hole 271A may overlap with the first channel structure 220A and expose the first channel contact 261A.

Figure 15A:
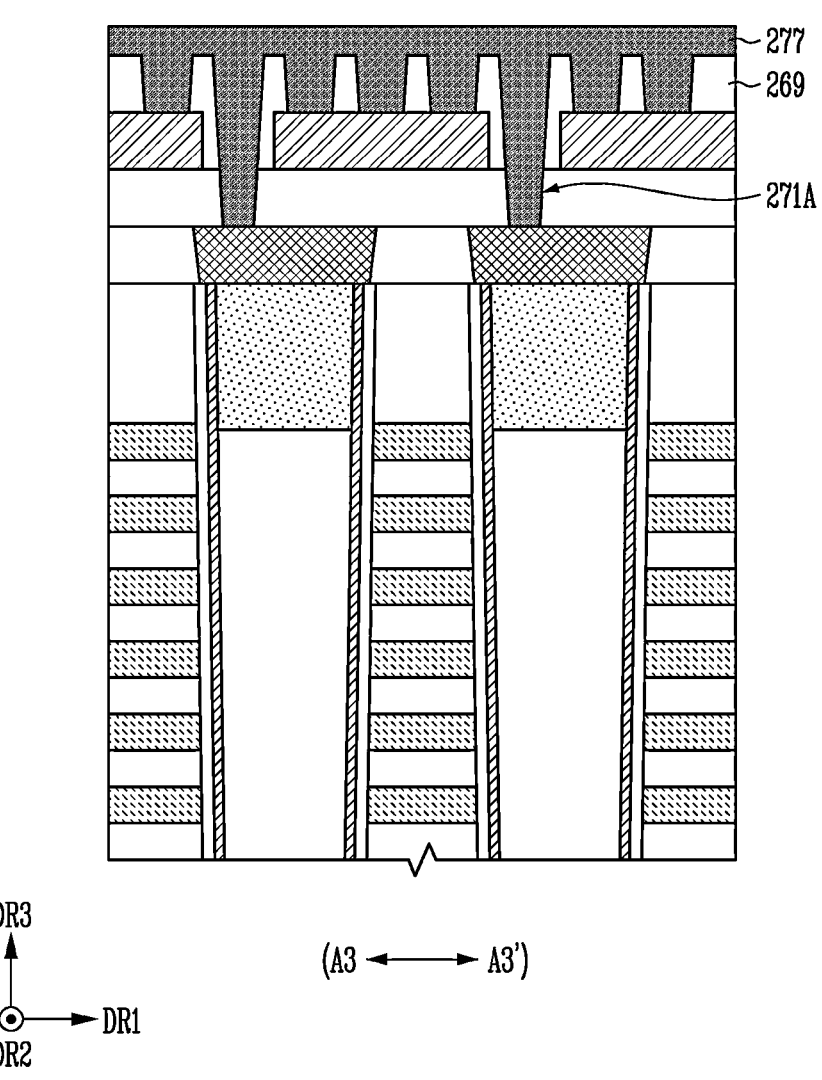
Figure 15B:
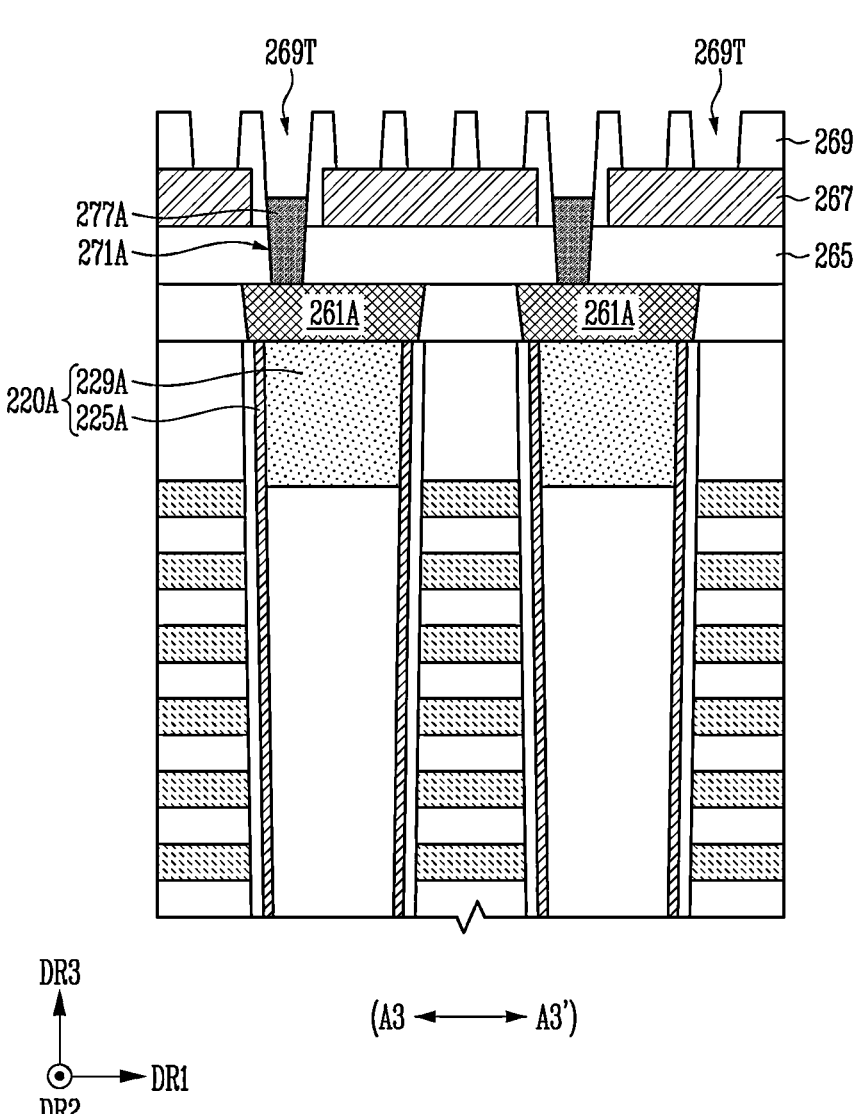
Figure 15C:
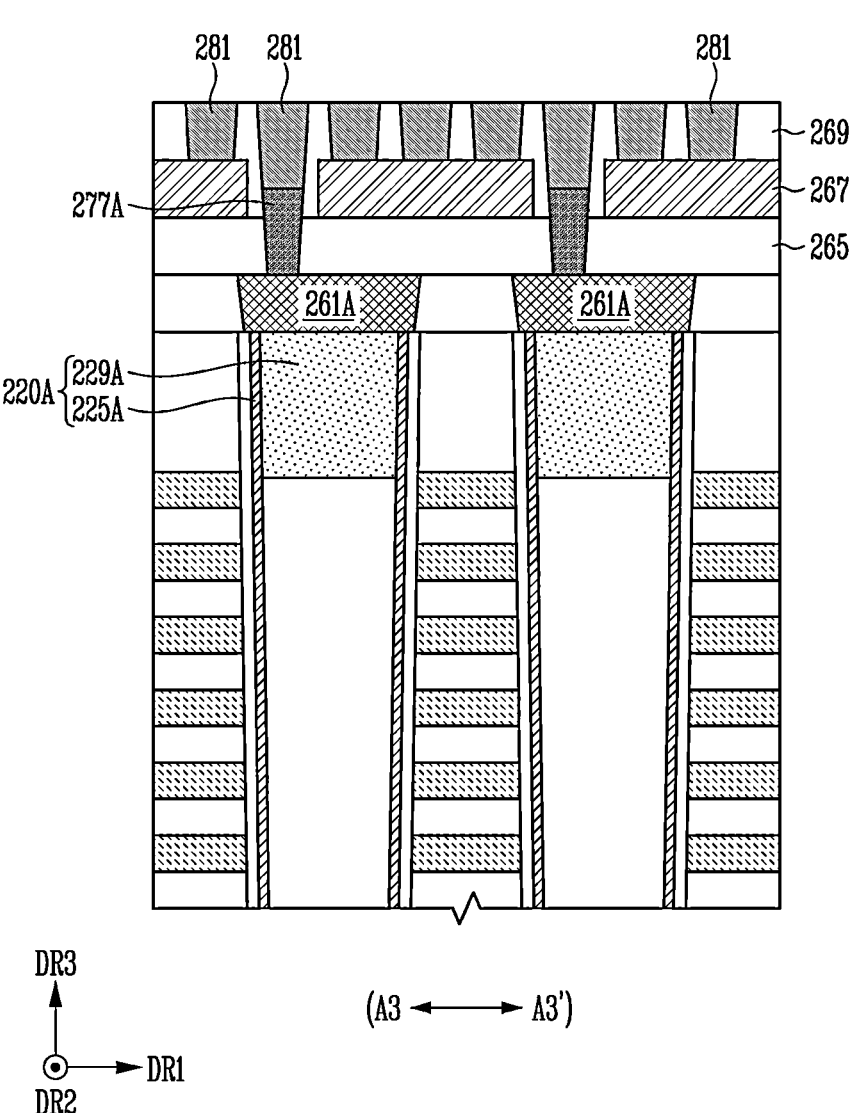

FIGS. 15A, 15B, and 15C are cross-sectional diagrams illustrating respective processes of forming a bit line contact and forming a plurality of bit lines.

Referring to FIG. 15A, a conductive layer 277 may be formed to fill the first bit line contact hole 271A and the second bit line contact hole 271B shown in FIGS. 14A and 14B.

Referring to FIG. 15B, bit line contacts may be formed and the plurality of second trenches 269T may be opened by removing the conductive layer 277 shown in FIG. 15A by an etching process such as an etch-back process.

The bit line contacts may include a first bit line contact 277A filling the first bit line contact hole 271A and a second bit line contact filling the second bit line contact hole 271B shown in FIG. 14A.

Referring to FIG. 15C, after a conductive layer is formed to fill the plurality of second trenches 269T shown in FIG. 15B, a planarization process may be performed to expose the second insulating layer 269. Accordingly, a plurality of bit lines 281 filling the plurality of second trenches 269T shown in FIG. 15B may be formed.

The semiconductor memory device described above with reference to FIGS. 4, 5, 6A, 6B, 6C, 7A, 7B, and 7C may be formed using the processes described above with reference to FIGS. 11A to 15C.

FIGS. 16A, 16B, 17A, 17B, 18A, 18B, 19A, and 19B are diagrams illustrating a method of manufacturing a semiconductor memory device according to an embodiment.

Figure 16A:
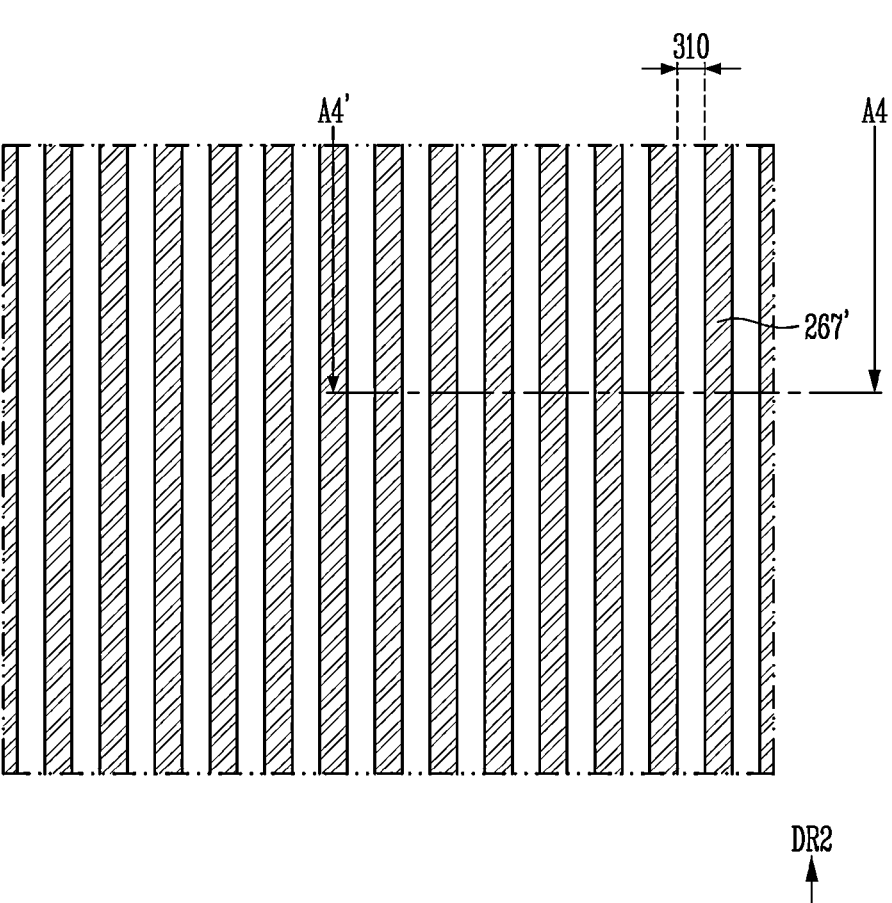
FIGS. 16A, 16B, 17A, 17B, 18A, 18B, 19A, and 19B are diagrams illustrating a method of manufacturing a semiconductor memory device according to an embodiment.
Figure 16A:
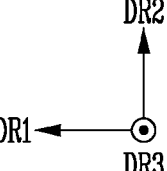
Figure 16B:
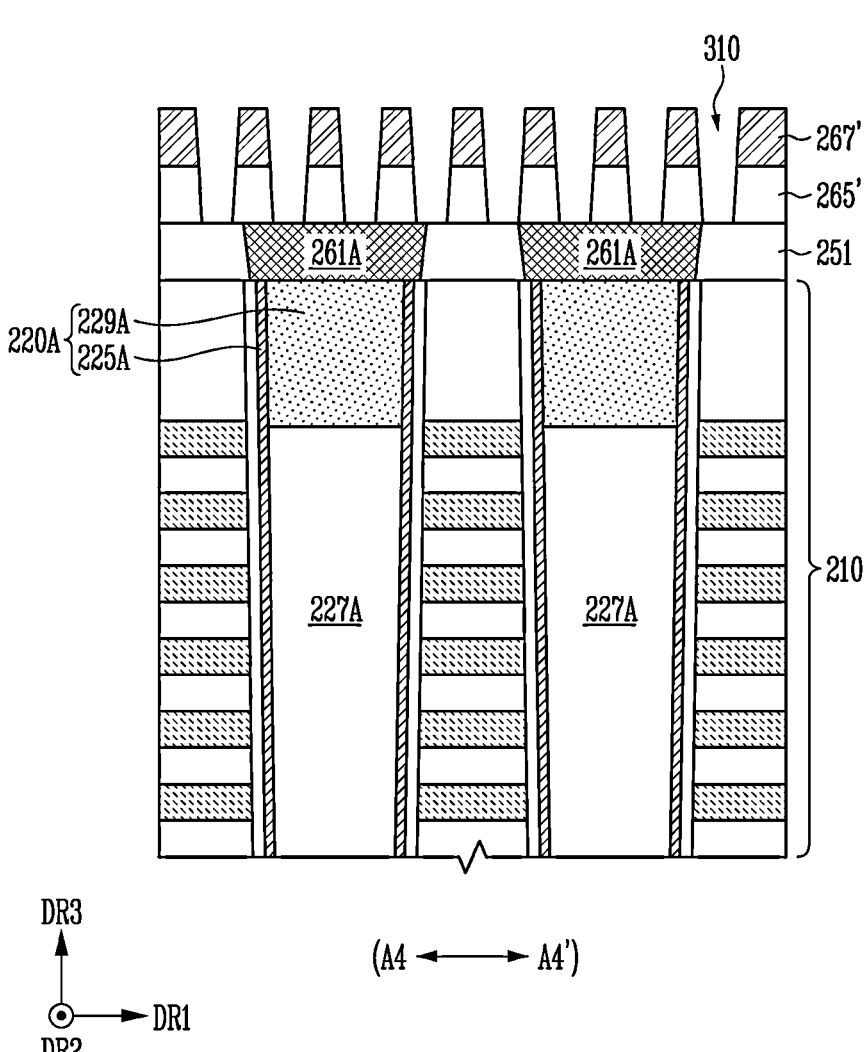

FIG. 16A is a plan view illustrating a step of forming a plurality of first trenches 310 and FIG. 16B is a cross-sectional diagram taken along line A4-A4' of FIG. 16A.

The processes described above with reference to FIGS. 11A and 11B may precede a process illustrated in FIGS. 16A and 16B. Accordingly, the gate stacked structure 210, the first memory layer 223A, the second memory layer 223B, the first channel structure 220A, the second channel structure 220B, the first core insulating layer 227A, the second core insulating layer 227B, the first vertical insulating structure 231, the second vertical insulating structure 263, the first channel contact 261A, and the second channel contact 261B that are described above with reference to FIGS. 11A and 11B may be formed.

Referring to FIGS. 16A and 16B, a first insulating layer 265' may be formed over the memory cell array that is provided by the processes described above with reference to FIGS. 11A and 11B. The first insulating layer 265' may be formed over the interposing insulating layer 251 as described above with reference to FIGS. 11A and 11B.

Subsequently, an etch stop layer 267' may be formed over the first insulating layer 265'. The etch stop layer 267' may include a material which is selected considering etch selectivity as described above with reference to FIGS. 12A and 12B. Subsequently, the plurality of first trenches 310 may be formed by etching the etch stop layer 267' and the first insulating layer 265'. The plurality of first trenches 310 may extend in the second direction DR2 to expose the first channel contact 261A and the second channel contact 261B shown in FIG. 11B. The plurality of first trenches 310 may be spaced apart from each other in the first direction DR1.

Figure 17A:
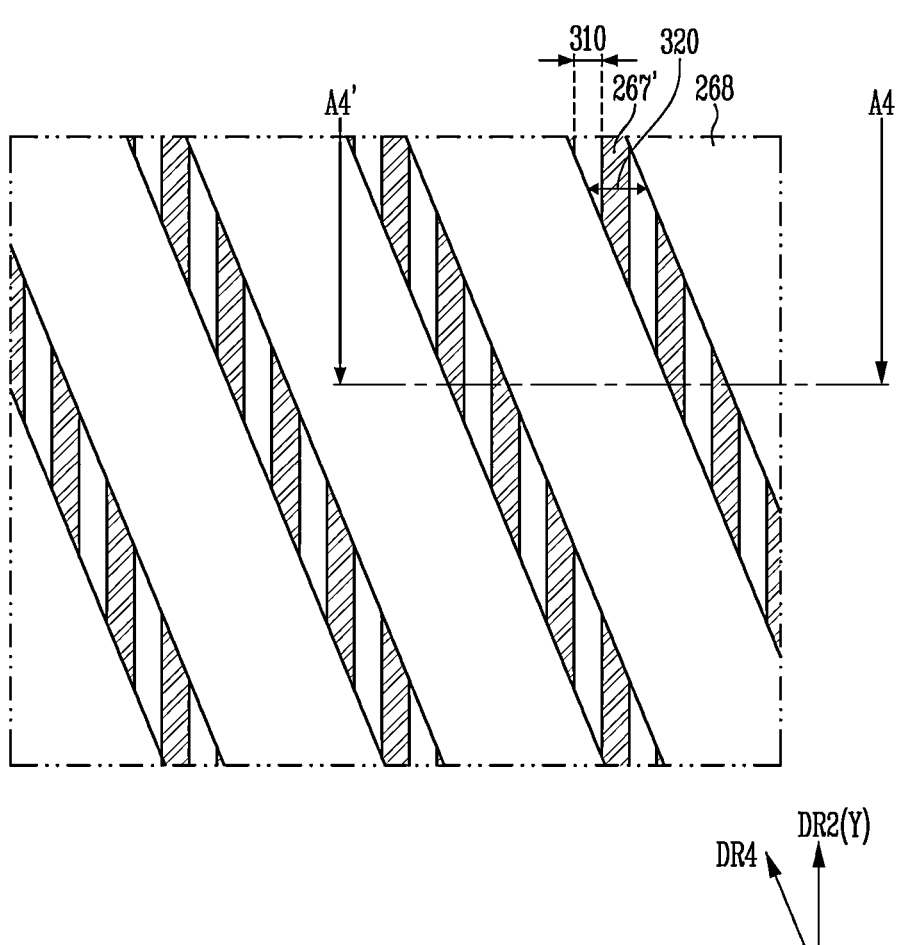
Figure 17B:
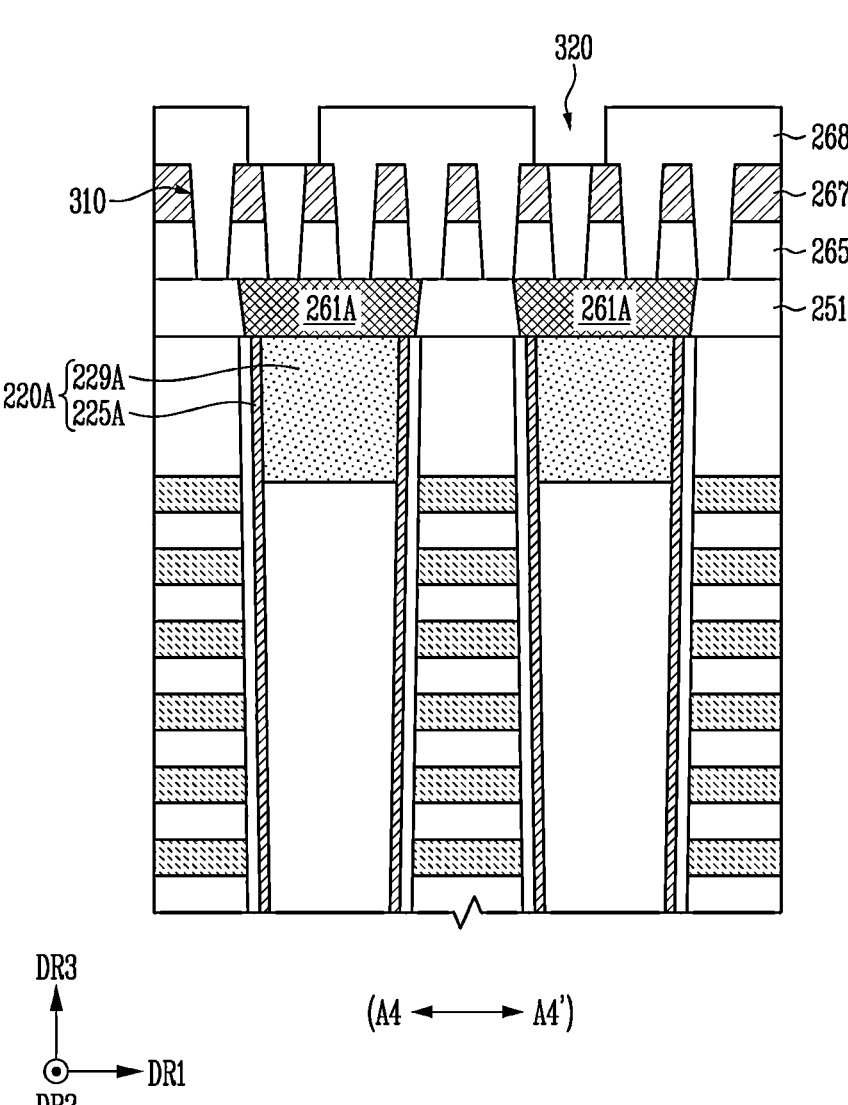

FIG. 17A is a plan view illustrating a step of forming a second trench 320 and FIG. 17B is a cross-sectional diagram taken along line A4-A4' of FIG. 17A.

Referring to FIGS. 17A and 17B, a gap-fill insulating layer 268 may be formed over the etch stop layer 267' to fill the plurality of first trenches 310. The gap-fill insulating layer 268 may include an insulating material having lower relative dielectric constant than the etch stop layer 267'. According to an embodiment, the gap-fill insulating layer 268 may include a silicon oxide.

Subsequently, the second trench 320 may be formed by etching the gap-fill insulating layer 268. The second trench 320 may extend in the diagonal direction DR4 between the first direction DR1 and the second direction DR2.

Each of the first trench 310 shown in FIGS. 16A and 16B and the second trench 320 shown in FIGS. 17A and 17B may be formed by a photolithography process and an etching process that correspond to each of the first trench 310 and the second trench 320.

Figure 18A:
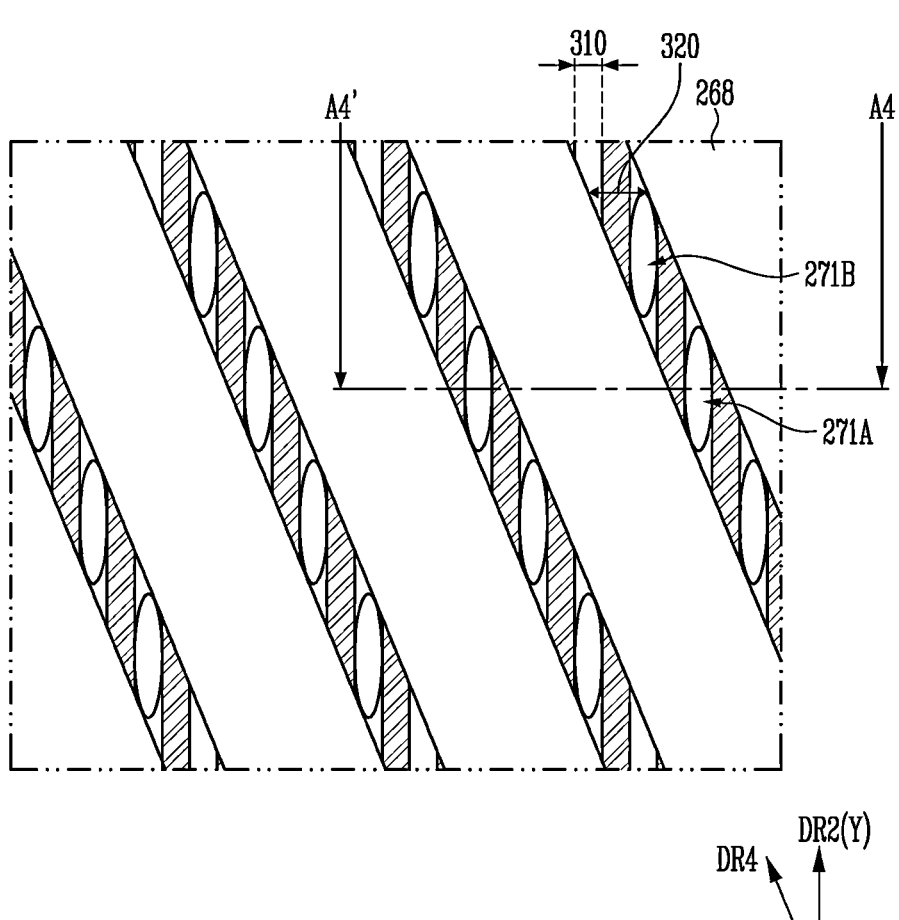
Figure 18B:
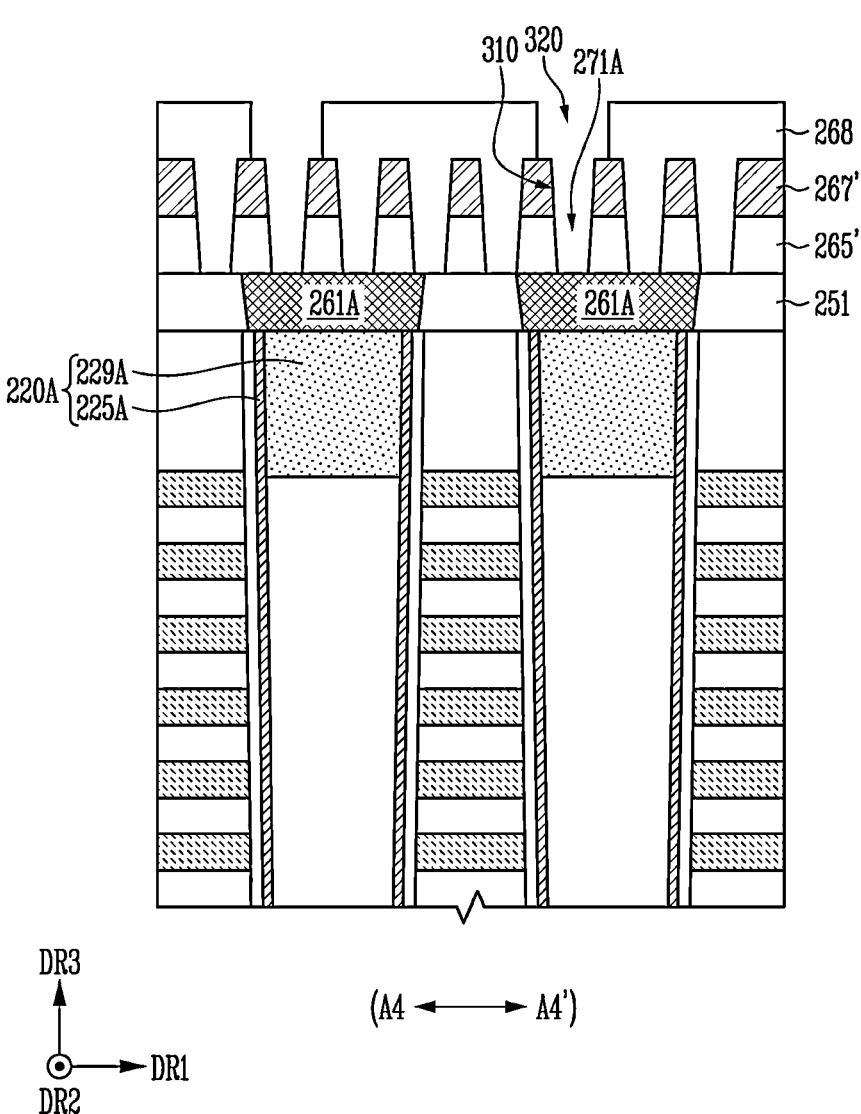

FIG. 18A is a plan view illustrating a step of forming the first bit line contact hole 271A and the second bit line contact hole 271B and FIG. 18B is a cross-sectional diagram taken along line A4-A4' of FIG. 18A.

Referring to FIGS. 18A and 18B, a part of the gap-fill insulating layer 268 in the first trench 310 may be exposed in a rhombus or parallelogram shape through overlapping parts of the first trench 310 and the second trench 320.

Subsequently, some regions of the gap-fill insulating layer 268 may be further etched to have a greater depth than other regions through the overlapping parts of the first trench 310 and the second trench 320. Accordingly, the first bit line contact hole 271A and the second bit line contact hole 271B may be formed. The etch stop layer 267' may serve as an etching barrier when some regions of the gap-fill insulating layer 268 are etched through the overlapping parts of the first trench 310 and the second trench 320. Regions corresponding to edges of a rhombus or a parallelogram may be processed to be rounded due to the effect of etch bias when some regions of the gap-fill insulating layer 268 are etched through the overlapping parts of the first trench 310 and the second trench 320.

Each of the first bit line contact hole 271A and the second bit line contact hole 271B may overlap with a channel structure corresponding thereto and expose a channel contact corresponding thereto. For example, the first bit line contact hole 271A may overlap with the first channel structure 220A and expose the first channel contact 261A.

Figure 19A:
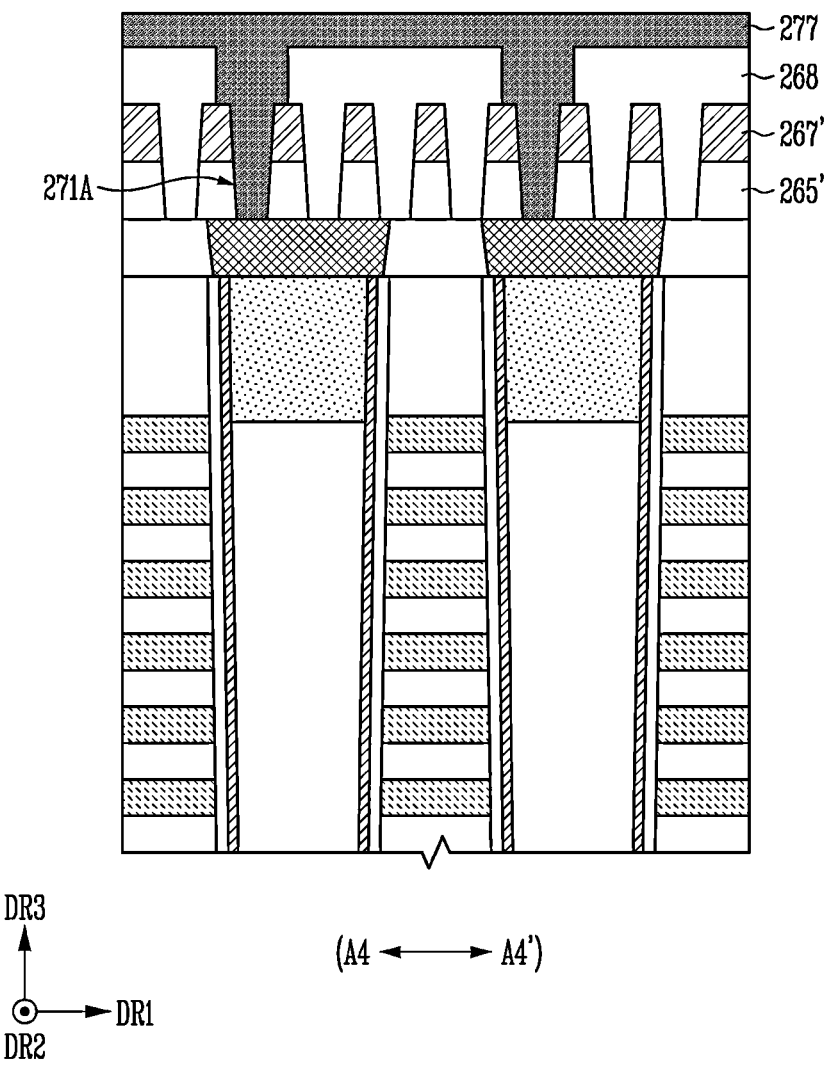
Figure 19B:
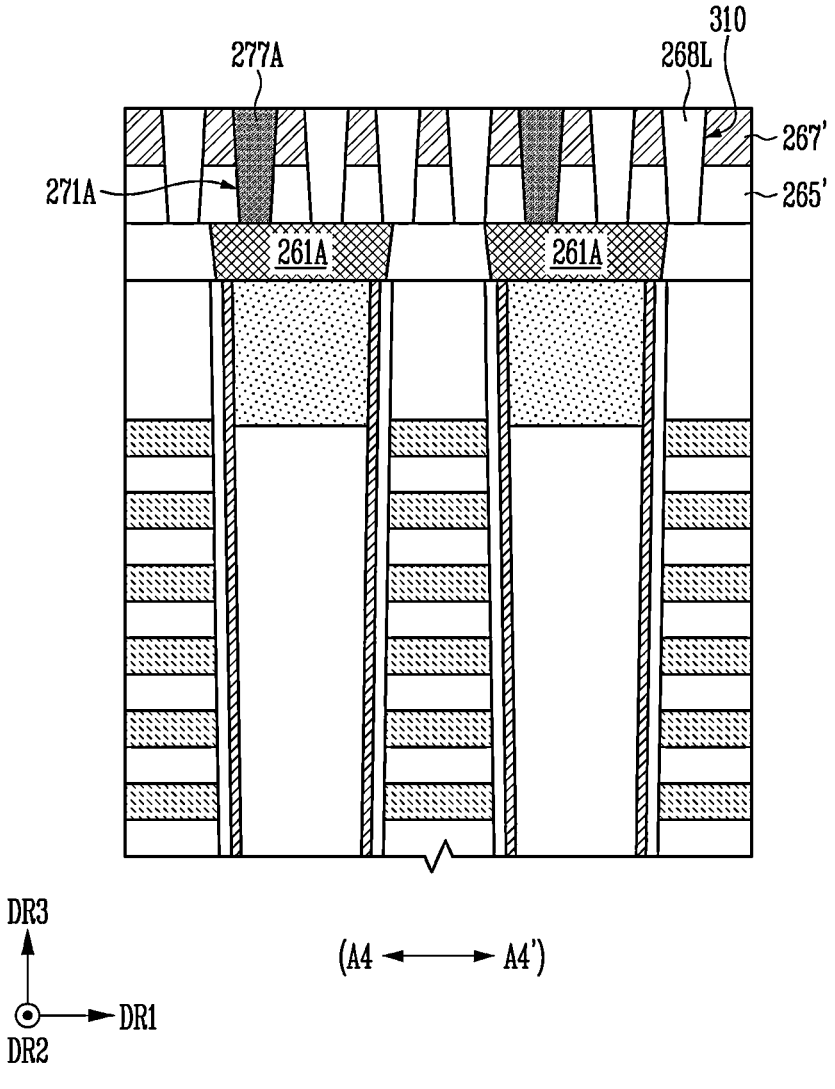

FIGS. 19A and 19B are cross-sectional diagrams illustrating respective processes of forming a bit line contact.

Referring to FIG. 19A, the conductive layer 277 may be formed to fill the first bit line contact hole 271A and the second bit line contact hole 271B shown in FIG. 18A.

Referring to FIG. 19B, bit line contacts may be formed by removing the conductive layer 277 shown in FIG. 19A by a planarization process to expose the etch stop layer 267'. The bit line contacts may include the first bit line contact 277A filling the first bit line contact hole 271A and the second bit line contact filling the second bit line contact hole 271B shown in FIG. 18A. A subsequent process for forming a second insulating layer and a plurality of bit lines may be performed.

The semiconductor memory device described above with reference to FIGS. 8, 9A, 9B, and 9C may be formed using the processes described above with reference to FIGS. 16A to 19B.

Figure 20:
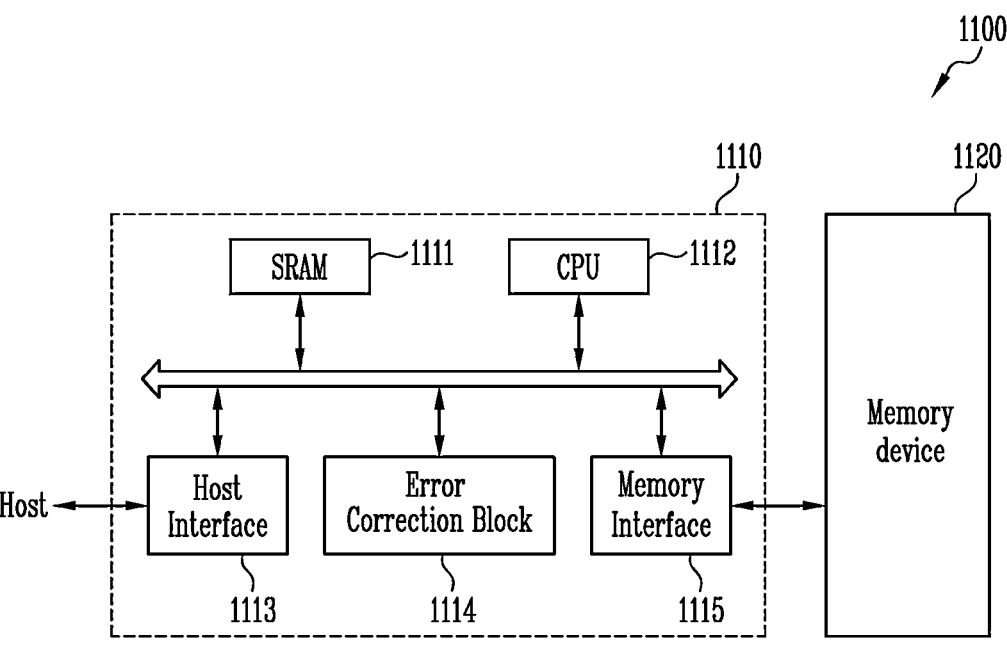
FIG. 20 is a block diagram illustrating a configuration of a memory system according to an embodiment.

FIG. 20 is a block diagram illustrating a configuration of a memory system 1100 according to an embodiment.

Referring to FIG. 20, the memory system 1100 may include a memory device 1120 and a memory controller 1110.

The memory device 1120 may be a multi-chip package including a plurality of flash memory chips. The memory device 1120 may include, in an embodiment, a first channel structure, a second channel structure, an etch stop layer having a trench that overlaps with the first and second channel structures, a first bit line contact and a second bit line contact that are arranged in a diagonal direction with respect to a direction in which the first and second channel structures are arranged and are coupled to the first channel structure and the second channel structure, respectively, and an insulating material in the trench.

The memory controller 1110 may be configured to control the memory device 1120 and may include Static Random Access Memory (SRAM) 1111, a Central Processing Unit (CPU) 1112, a host interface 1113, an error correction block 1114, and a memory interface 1115. The SRAM 1111 may serve as operating memory of the CPU 1112, the CPU 1112 may perform general control operations for data exchange of the memory controller 1110, and the host interface 1113 may include a data exchange protocol of a host accessing the memory system 1100. The error correction block 1114 may detect and correct errors included in data read from the memory device 1120. The memory interface 1115 may interface with the memory device 1120. The memory controller 1110 may further include Read Only Memory (ROM) for storing code data for interfacing with the host.

The memory system 1100 having the above-described configuration may be a Solid-State Drive (SSD) or a memory card in which the memory device 1120 and the memory controller 1110 are combined. For example, when the memory system 1100 is an SSD, the memory controller 1110 may communicate with an external device (e.g., the host) through one of various interface protocols including a Universal Serial Bus (USB), a MultiMedia Card (MMC), Peripheral Component Interconnect Express (PCIe), Serial Advanced Technology Attachment (SATA), Parallel Advanced Technology Attachment (PATA), a Small Computer System Interface (SCSI), an Enhanced Small Disk Interface (ESDI), and Integrated Drive Electronics (IDE).

Figure 21:
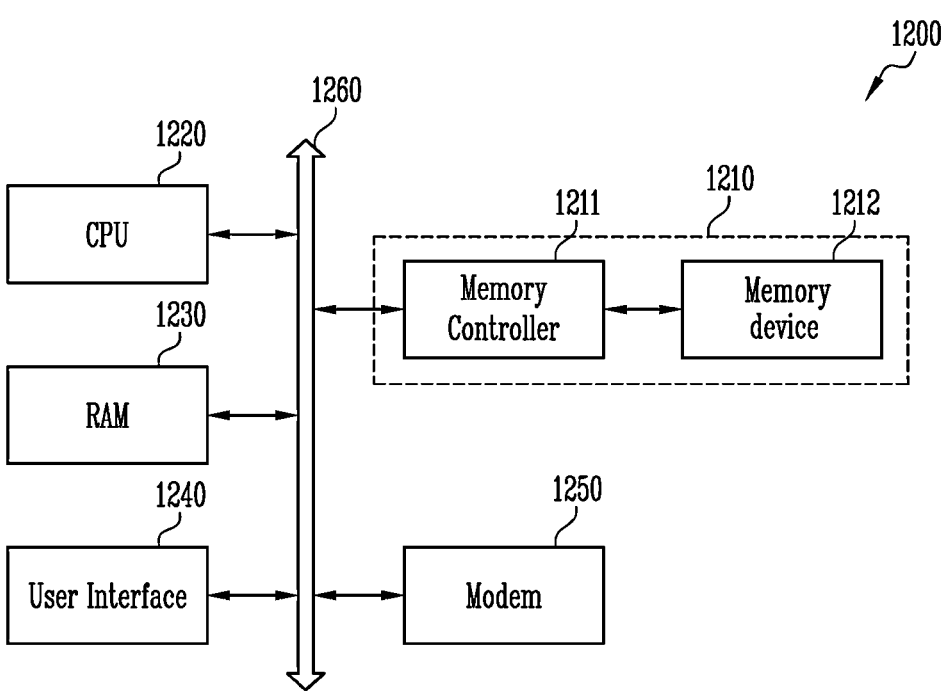
FIG. 21 is a block diagram illustrating a configuration of a computing system according to an embodiment.

FIG. 21 is a block diagram illustrating a configuration of a computing system 1200 according to an embodiment.

Referring to FIG. 21, the computing system 1200 may include a CPU 1220, Random Access Memory (RAM) 1230, a user interface 1240, a modem 1250, and a memory system 1210 that are electrically coupled to a system bus 1260. When the computing system 1200 is a mobile device, a battery for supplying an operating voltage to the computing system 1200 may be further included, and an application chipset, an image processor, mobile DRAM, and the like may be further included.

The memory system 1210 may include a memory device 1212 and a memory controller 1211. The memory device 1212 may be configured in the same manner as the memory device 1120 described above with reference to FIG. 20. The memory controller 1211 may be configured in the same manner as the memory controller 1110 described above with reference to FIG. 20.

According to embodiments of the present disclosure, a photolithography process that targets a line-type opening such as a trench instead of a hole-type opening may be performed in patterning an etch stop layer. In an embodiment, when the photolithography process is performed to target the line-type opening rather than the hole-type opening, margins of an exposure process may be increased, and therefore, process margins of a semiconductor memory device may be secured according to embodiments of the present disclosure.

According to embodiments of the present disclosure, a part of the etch stop layer that is adjacent to a bit line contact is replaced by an insulating material that is different from the etch stop layer, and therefore, parasitic capacitance occurring due to the etch stop layer may be decreased. Accordingly, in an embodiment, operational reliability of the semiconductor memory device may be improved.

What is claimed is:

1. A semiconductor memory device, comprising:
a gate stacked structure including conductive layers, each of the conductive layers extending in a first direction and a second direction and including a top surface facing a third direction, wherein the conductive layers are stacked to be spaced apart from each other in the third direction;
a first channel structure and a second channel structure extending in the third direction to pass through the gate stacked structure and spaced apart from each other in the second direction;

a first insulating layer disposed over the gate stacked structure;

an etch stop layer disposed over the first insulating layer and including a trench, the trench extending in a diagonal direction between the first direction and the second direction;

a second insulating layer including a horizontal portion and a protrusion, the horizontal portion located over the etch stop layer and the protrusion extending from the horizontal portion and into the trench;

a first bit line disposed in the second insulating layer and extending in the second direction to overlap with the first channel structure and the second channel structure; and a first bit line contact extending from the first bit line to pass through the first insulating layer in a part where the first bit line overlaps with the trench.

2. The semiconductor memory device of claim 1, further comprising a vertical insulating structure between the first channel structure and the second channel structure, wherein the gate stacked structure includes a channel hole extending in the third direction, and wherein the first channel structure, the second channel structure, and at least a portion of the vertical insulating structure are disposed in the channel hole.

3. The semiconductor memory device of claim 2, wherein a width of the channel hole in the second direction is greater than a width of the channel hole in the first direction.

4. The semiconductor memory device of claim 1, wherein the first channel structure and the second channel structure have substantially semi-ellipse shapes that are substantially symmetrical to each other.

5. The semiconductor memory device of claim 1, further comprising:

a first memory layer between the gate stacked structure and the first channel structure;

a second memory layer between the gate stacked structure and the second channel structure; and a vertical insulating structure extending from between the first channel structure and the second channel structure to between the first memory layer and the second memory layer.

6. The semiconductor memory device of claim 1, further comprising:

an interposing insulating layer between the gate stacked structure and the first insulating layer;

a channel contact hole passing through the interposing insulating layer and extending to overlap with the first channel structure and the second channel structure;

a first channel contact disposed in a region of the channel contact hole that corresponds to the first channel structure and connected to the first channel structure;

a second channel contact disposed in a region of the channel contact hole that corresponds to the second channel structure and connected to the second channel structure; and a vertical insulating structure disposed in a region of the channel contact hole that is between the first channel contact and the second channel contact.

7. The semiconductor memory device of claim 1, wherein each of the first insulating layer and the second insulating layer has a lower relative dielectric constant than the etch stop layer.

8. The semiconductor memory device of claim 1, wherein an axis extending in the diagonal direction and an axis extending in the second direction cross at an angle of 10° to 45°.

9. The semiconductor memory device of claim 1, further comprising:

a second bit line disposed in the second insulating layer and extending in the second direction to overlap with the first channel structure and the second channel structure; and a second bit line contact extending from the second bit line to pass through the first insulating layer in a part where the second bit line overlaps with the trench.

10. The semiconductor memory device of claim 9, wherein the protrusion of the second insulating layer comprises:

a part interposed between the first bit line contact and the second bit line contact; and a part interposed between the first bit line and the second bit line.

11. A semiconductor memory device, comprising:

a gate stacked structure including conductive layers, each of the conductive layers extending in a first direction and a second direction and including a top surface facing a third direction, wherein the conductive layers are stacked to be spaced apart from each other in the third direction;

a first channel structure and a second channel structure extending in the third direction to pass through the gate stacked structure and spaced apart from each other in the second direction;

a first insulating layer disposed over the gate stacked structure;

an etch stop layer disposed over the first insulating layer;

a first insulating line and a second insulating line passing through the etch stop layer and the first insulating layer, extending in the second direction to overlap with the first channel structure and the second channel structure, and spaced apart from each other in the first direction;

a first bit line contact passing through the first insulating line and the first insulating layer in a part where the first insulating line overlaps with the first channel structure; and a second bit line contact passing through the second insulating line and the first insulating layer in a part where the second insulating line overlaps with the second channel structure.

12. The semiconductor memory device of claim 11, further comprising a vertical insulating structure between the first channel structure and the second channel structure, wherein the gate stacked structure includes a channel hole that extends in the third direction, and wherein the first channel structure, the second channel structure, and the vertical insulating structure are disposed in the channel hole.

13. The semiconductor memory device of claim 12, wherein a width of the channel hole in the second direction is greater than a width of the channel hole in the first direction.

14. The semiconductor memory device of claim 13, further comprising:

a first bit line coupled to the first bit line contact and disposed over the first insulating line; and a second bit line coupled to the second bit line contact and disposed over the second insulating line.

15. The semiconductor memory device of claim 11, wherein the first channel structure and the second channel structure have substantially semi-ellipse shapes that are substantially symmetrical to each other.

16. The semiconductor memory device of claim 11, further comprising:

a first memory layer between the gate stacked structure and the first channel structure;

a second memory layer between the gate stacked structure and the second channel structure; and a vertical insulating structure extending from between the first channel structure and the second channel structure to between the first memory layer and the second memory layer.

17. The semiconductor memory device of claim 11, further comprising:

an interposing insulating layer between the gate stacked structure and the first insulating layer;

a channel contact hole passing through the interposing insulating layer and extending to overlap with the first channel structure and the second channel structure;

a first channel contact disposed in a region of the channel contact hole that corresponds to the first channel structure and connected to the first channel structure;

a second channel contact disposed in a region of the channel contact hole that corresponds to the second channel structure and connected to the second channel structure; and a vertical insulating structure disposed in a region of the channel contact hole that is between the first channel contact and the second channel contact.

18. The semiconductor memory device of claim 11, wherein each of the first insulating layer, the first insulating line, and the second insulating line has a lower relative dielectric constant than the etch stop layer.

19. The semiconductor memory device of claim 11, wherein the first bit line contact and the second bit line contact are aligned with each other in a diagonal direction between the first direction and the second direction.

20. The semiconductor memory device of claim 19, wherein an axis extending in the diagonal direction and an axis extending in the second direction cross at an angle of 10° to 45°.

* * * * *